(12) United States Patent
Kim et al.

(10) Patent No.: US 11,398,589 B2
(45) Date of Patent: Jul. 26, 2022

(54) LIGHT EMITTING DEVICE PACKAGE AND LIGHT SOURCE DEVICE

(71) Applicant: SUZHOU LEKIN SEMICONDUCTOR CO., LTD., Taicang (CN)

(72) Inventors: Won Jung Kim, Seoul (KR); June O Song, Seoul (KR); Chang Man Lim, Seoul (KR); Ki Seok Kim, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 98 days.

(21) Appl. No.: 16/769,900

(22) PCT Filed: Nov. 30, 2018

(86) PCT No.: PCT/KR2018/015034
§ 371 (c)(1),
(2) Date: Jun. 4, 2020

(87) PCT Pub. No.: WO2019/112250
PCT Pub. Date: Jun. 13, 2019

(65) Prior Publication Data
US 2021/0184090 A1    Jun. 17, 2021

(30) Foreign Application Priority Data

Dec. 5, 2017 (KR) .................. 10-2017-0166005
Jan. 26, 2018 (KR) .................. 10-2018-0010230

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC ..... H01L 33/483; H01L 33/486; H01L 33/62; H01L 25/0753; H01L 33/60; H01L 2933/0033; H01L 25/167
See application file for complete search history.

(56) References Cited

U.S. PATENT DOCUMENTS

2008/0149962 A1  6/2008  Kim et al.
2009/0101897 A1  4/2009  Murphy et al.
(Continued)

FOREIGN PATENT DOCUMENTS

KR  10-0845856  7/2008
KR  10-0947400  3/2010
(Continued)

OTHER PUBLICATIONS

International Search Report dated Mar. 21, 2019 issued in Application No. PCT/KR2018/015034.

*Primary Examiner* — Feifei Yeung Lopez
(74) *Attorney, Agent, or Firm* — Birch, Stewart, Kolasch & Birch, LLP

(57) ABSTRACT

The light emitting device package disclosed in the embodiment includes a first frame having a first through hole; a second frame having a second through hole; a body disposed between the first and second frames; and light emitting devices disposed on the first and second frames, wherein the first and second through holes have an area of a lower surface larger than an area of the upper surface, and centers of the upper and lower surfaces of the first through hole may be offset from each other in the vertical direction, and centers of the upper and lower surfaces of the second
(Continued)

through hole may be offset from each other in the vertical direction.

20 Claims, 23 Drawing Sheets

(51) Int. Cl.
    *H01L 33/48*     (2010.01)
    *H01L 33/60*     (2010.01)
    *H01L 25/16*     (2006.01)

(52) U.S. Cl.
    CPC ............ *H01L 33/486* (2013.01); *H01L 33/60* (2013.01); *H01L 33/483* (2013.01); *H01L 2933/0033* (2013.01)

(56) References Cited

U.S. PATENT DOCUMENTS

| | | | |
|---|---|---|---|
| 2009/0162957 A1 | 6/2009 | Joung | |
| 2015/0348906 A1 | 12/2015 | Park et al. | |
| 2019/0027641 A1* | 1/2019 | Lee | ....................... H01L 33/486 |

FOREIGN PATENT DOCUMENTS

| KR | 10-1524048 | 5/2015 |
|---|---|---|
| KR | 10-2015-0139660 | 12/2015 |

* cited by examiner

LIGHT EMITTING DEVICE PACKAGE AND LIGHT SOURCE DEVICE

CROSS-REFERENCE TO RELATED PATENT APPLICATIONS

This application is a U.S. National Stage Application under 35 U.S.C. § 371 of PCT Application No. PCT/KR2018/015034, filed Nov. 30, 2018, which claims priority to Korean Patent Application Nos. 10-2017-0166005, filed Dec. 5, 2017 and 10-2018-0010230, filed Jan. 26, 2018, whose entire disclosures are hereby incorporated by reference.

TECHNICAL FIELD

An embodiment of the invention relates to a light emitting device package and a light source device.

BACKGROUND ART

Light emitting devices such as Light Emitting Diode or Laser Diode using Group III-V or II-VI compound semiconductor materials have an advantage capable of realizing light of various wavelength bands such as red, green, blue, and ultraviolet light by development as thin film growth technology and device materials. As a light emitting device capable of providing a high output is requested, research is being conducted on a device capable of high output by applying high power. In addition, research is being conducted on a method of improving the light extraction efficiency of the light emitting device and improving the light intensity at the package stage. In addition, research is being conducted on a method of improving the bonding strength between the electrode of the light emitting device package and the light emitting device.

SUMMARY

An embodiment of the present invention may provide a light emitting device package in which a center of an upper surface and a center of a lower surface of a through hole of the frame are disposed to be offset from each other under the light emitting device. An embodiment of the present invention may provide a light emitting device package in which a through hole of a frame or a lower shape of the through hole includes an asymmetric shape in at least one direction. An embodiment of the present invention may provide a light emitting device package in which at least one or both of a conductive portion and a conductive protrusion of a light emitting device is disposed in a through hole of a frame. An embodiment of the present invention may provide a light emitting device package in which a first resin is disposed in a recess of a body disposed between frames and the light emitting devices are adhered. An embodiment of the present invention may provide a light emitting device package in which a plurality of light emitting devices disposed on frames are connected through a conductive portion disposed in a through hole.

An embodiment of the present invention provides a light emitting device package in which a light emitting device is connected by disposing a metal connection portion in a through hole of the body. An embodiment of the present invention provides a light emitting device package that connects a plurality of light emitting devices by extending a metal connection portion disposed under the body to a through hole of the body. An embodiment of the present invention provides a light emitting device package in which a plurality of light emitting devices are connected in series or in parallel.

A light emitting device package according to an embodiment of the present invention includes a first frame including a first through hole; a second frame including a second through hole; a body disposed between the first and second frames; a light emitting devices disposed on the first and second frames, and an area of lower surfaces of the first and second through holes is greater than an area of upper surfaces of the first and second through holes, and a center of the upper surface and a center of the lower surface of the first through hole are disposed to be offset from each other in a vertical direction, and a center of the upper surface and a center of the lower surface of the second through hole may be disposed to be offset from each other in the vertical direction.

A light emitting device package according to an embodiment of the present invention includes a plurality of frames; a plurality of through holes disposed in each of the plurality of frames; a body disposed between the plurality of frames; a light emitting device disposed on the plurality of frames and the body; and a resin disposed on the upper surface of the plurality of frames, the upper surface of the body and the through holes, wherein the light emitting device includes a plurality of conductive protrusions penetrating each of the plurality of through holes on a lower portion of the light emitting device, and the plurality of the conductive protrusions are exposed at a lower surface of the plurality of frames, the plurality of conductive protrusions have a pillar shape made of metal, and the plurality of conductive protrusions have a height equal to or greater than a thickness of the frame, and a center of an upper surface and a center of a lower surface of each of the plurality of through holes may be disposed to be offset from each other in the vertical direction.

According to an embodiment of the invention, a width of the lower surface of the first through hole is wider than a width of an upper surface of the first through hole in the first direction, and a width of a lower surface of the second through hole may be wider than a width of an upper surface of the second through hole in the first direction. The width of the lower surface of the first through hole may be wider than the width of the upper surface of the first through hole in the second direction, and the width of the lower surface of the second through hole may be wider than the width of the upper surface of the second through hole in the second direction. The light emitting device may have a length in a first direction longer than a length in a second direction. According to an embodiment of the invention, the center of the lower surface of the first and second through holes may be further spaced apart from the body than the center of the upper surface of the first and second through holes. The center of the lower surface of the first through hole is spaced away from the second frame based on the center of the upper surface of the first through hole, and the center of the lower surface of the second through hole may be spaced away from the first frame based on the center of the upper surface of the second through hole.

According to an embodiment of the invention, the body may have at least one recess on an upper portion of the body and a first resin disposed on the recess. A conductive portion may be disposed in the first and second through holes. The light emitting device includes conductive protrusions disposed in the first and second through holes, and the conductive protrusions may contact the conductive portions. According to an embodiment of the invention, a second resin may be disposed around the lower portion of the light emitting device. A third resin or a conductive portion is disposed in the first and second through holes, and the light emitting device may include conductive protrusions disposed in the first and second through holes. The conductive protrusion may be exposed on the lower surfaces of the frames through the first and second through holes. The conductive protrusion may have a thickness greater than the thickness of the first and second frames. The recess may overlap the light emitting device in a vertical direction. The recess may have an inner portion overlapping the light emitting device in a vertical direction and an outer portion extending in the outer direction from the light emitting device. According to an embodiment of the present invention, the recess is disposed in plural, and the depth of the recess may be smaller than the depth of the through hole. A third frame is spaced apart from the first or second frame, a plurality of light emitting devices are disposed on the first to third frames and may be connected in series with each other.

A light source device according to an embodiment includes a circuit board; and one or more light emitting device packages may be disposed on the circuit board.

Advantageous Effects

According to the invention, the conductive portion is provided in the through hole of the frame facing the bonding portions of the light emitting element, so that the bonding strength and electrical conductivity of the bonding portion may be improved. According to the invention, the conductive protrusions of the pillar shape protruding under the bonding portion of the light emitting device are disposed in the through holes of the frames, so that the adhesive strength and electrical conductivity of the bonding portion of the flip chip may improve. According to the invention, it is possible to improve the adhesion and electrical conductivity of the conductive protrusions of the flip chip by arranging the resin and the pillar-shaped conductive protrusions protruding below the bonding portion of the light emitting device in the through hole of the frame.

According to the present invention, the through hole of the frame facing the bonding portions of the light emitting device is provided in a non-symmetrical shape, thereby improving adhesion and electrical conductivity of the bonding portion. According to the invention, it is possible to improve adhesion and support of the light emitting device by disposing a first resin for adhesion between the light emitting device and the body. According to the present invention, the first resin may be disposed in the recess of the body facing the light emitting device, thereby improving the adhesion and the supporting force of the light emitting device. According to an embodiment, a high voltage package can be provided by arranging one or a plurality of light emitting cells in a plurality of light emitting devices. According to an embodiment, a plurality of light emitting devices may be connected in series to provide a high voltage package. According to an embodiment, a plurality of light emitting devices may be selectively connected to a frame or a conductive portion to switch the driving voltage of the package.

According to the embodiment, it is possible to improve light extraction efficiency and electrical characteristics and reliability. According to the embodiment, it is possible to improve the process efficiency of the package, reduce the manufacturing cost, and improve the production yield. The package of the embodiment may improve reliability by suppressing discoloration of the body by providing a body having a high reflectance. According to an embodiment, it is possible to prevent a re-melting phenomenon from occurring in the process of re-bonding the light emitting device package to a board.

DETAILED DESCRIPTION

Figure 1:
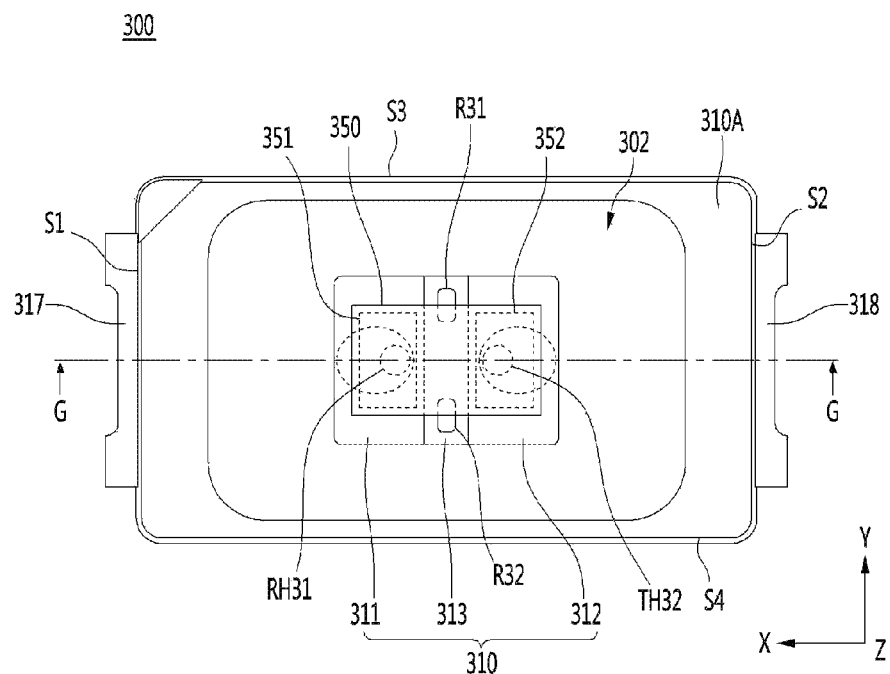
FIG. 1 is a plan view of a light emitting device package according to a first embodiment of the present invention.

Hereinafter, preferred embodiments of the present invention will be described in detail with reference to the accompanying drawings. The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, can be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

First Embodiment

FIGS. 1 to 9 are examples of drawings for the first embodiment of the present invention. Referring to FIGS. 1 to 9, the light emitting device package 300 may include a package body 310 and a light emitting device 350. The package body 310 may include a body 313 and frames 311 and 312. The frames 311 and 312 may include a spaced first frame 311 and a second frame 312, and the body 313 may be disposed between the first frame 311 and the second frame 312. The body 313 may be further disposed on the first frame 311 and the second frame 312. The body 313 may provide an inclined inner surface to the cavity 302 in which the upper part is opened, and the cavity 302 may expose upper surfaces of the first frame 311 and the second frame 312. The inner surface of the cavity 302 may be arranged in a step structure of one or more stages or two or more stages. The package body 310 may be provided with a structure having the cavity 302 or a flat surface without the cavity. An upper body 310A having the cavity 302 may be disposed on the body 313. The upper body 310A may be the same material as the body 313 or may be disposed as a separate material. For example, the body 313 is PPA (Polyphthalamide), PCT (Polychloro Triphenyl), LCP (Liquid Crystal Polymer), PA9T (Polyamide9T), silicone, epoxy, EMC (Epoxy molding compound), SMC (Silicon molding compound), Ceramic, photosensitive glass (PSG), or sapphire (Al2O3). The body 313 may include a high refractive filler such as TiO2 and SiO2 inside the resin. The upper body 310A may be made of resin or an insulating material, or function as a reflective body. The length of the first direction X of the package body 310 may be greater than or equal to the length of the second direction Y. In the package body 310 or the body 313, the first and second side surfaces S1 and S2 extend in the second direction and may be opposite sides to each other, and the third and fourth side surfaces S3 and S4 extend in the second direction and may be opposite sides to each other. The first to fourth side surfaces S1, S2, S3, and S4 may be vertically or inclined, and may be outer sides of the body 313.

The first frame 311 and the second frame 312 may be provided as conductive or metal frames. The metal frame is, for example, copper (Cu), titanium (Ti), nickel (Ni), gold (Au), chromium (Cr), tantalum (Ta), platinum (Pt), tin (Sn), silver (Ag)), and may be formed in a single layer or multiple layers. The first extension portion 317 of the first frame 311 may extend or protrude toward a direction of the first side surface S1. The second extension portion 318 of the second frame 312 may extend or protrude toward a direction of the second side surface S2. Each of the first and second extension portions 317 and 318 may be arranged in one or more. As another example, the first frame 311 and the second frame 312 may be provided as insulating frames.

The light emitting device 350 may include first and second bonding portions 351 and 352 and a light emitting structure 353. The light emitting device 350 may include a light-transmitting material substrate 354. The length of the first direction in the light emitting device 350 may be greater than or equal to the length of the second direction. The light emitting structure 353 may be provided as a compound semiconductor, and may include an active layer between the first and second conductivity type semiconductor layers and the first and second conductivity type semiconductor layers. The first bonding portion 351 may be electrically connected to the first conductivity type semiconductor layer. The second bonding portion 352 may be electrically connected to the second conductivity type semiconductor layer. The active layer may be embodied as at least one of a compound semiconductor of group III-V or group II-VI. The substrate 354 may be selected from sapphire substrate (Al2O3), SiC, GaAs, GaN, ZnO, Si, GaP, InP, Ge.

The light emitting device 350 may be disposed on the first and second frames 311 and 312 and the body 313. The light emitting device 350 may be disposed in the cavity 302. The first bonding portion 351 is disposed between the light emitting structure 353 and the first frame 311, and the second bonding portion 352 may be disposed between the light emitting structure 353 and the second frame 312. The first and second bonding portions 351 and 352 may be formed of single or multi-layer using one or more materials or alloys selected from the group consisting of Ti, Al, In, Ir, Ta, Pd, Co, Cr, Mg, Zn, Ni, Si, Ge, Ag, Ag alloy, Au, Hf, Ru, Rh, ZnO, IrOx, RuOx, NiO, RuOx/ITO, Ni/IrOx/Au, Ni/IrOx/ITO. The light emitting device 350 may include one or a plurality of light emitting cells therein. The light emitting cell may include at least one light emitting structure among n-p junction, p-n junction, n-p-n junction, and p-n-p junction. The plurality of light emitting cells may be connected to each other in series within one light emitting device. Accordingly, the light emitting device may have one or a plurality of light emitting cells, and when n light emitting cells are disposed in one light emitting device, the light emitting device may be driven with a driving voltage of n times.

Figure 3:
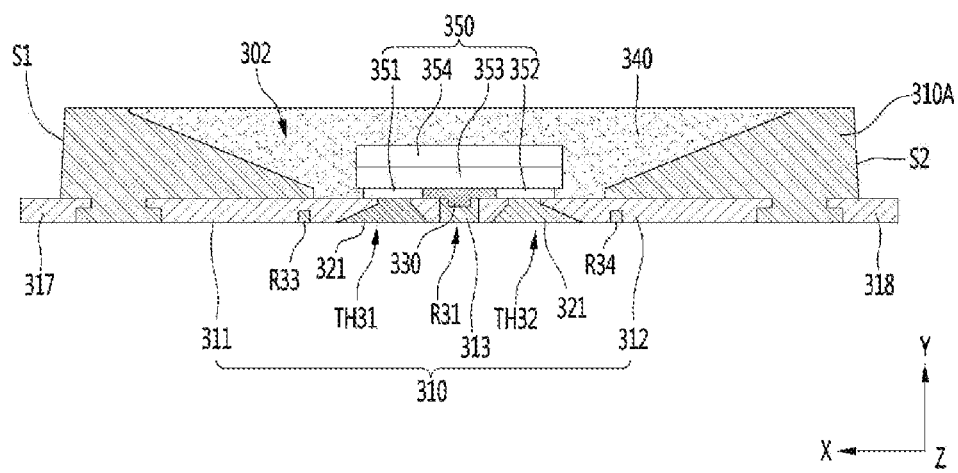
FIG. 3 is an example of a cross-sectional view taken along the G-G side of the light emitting device package of FIG. 1.
Figure 4:
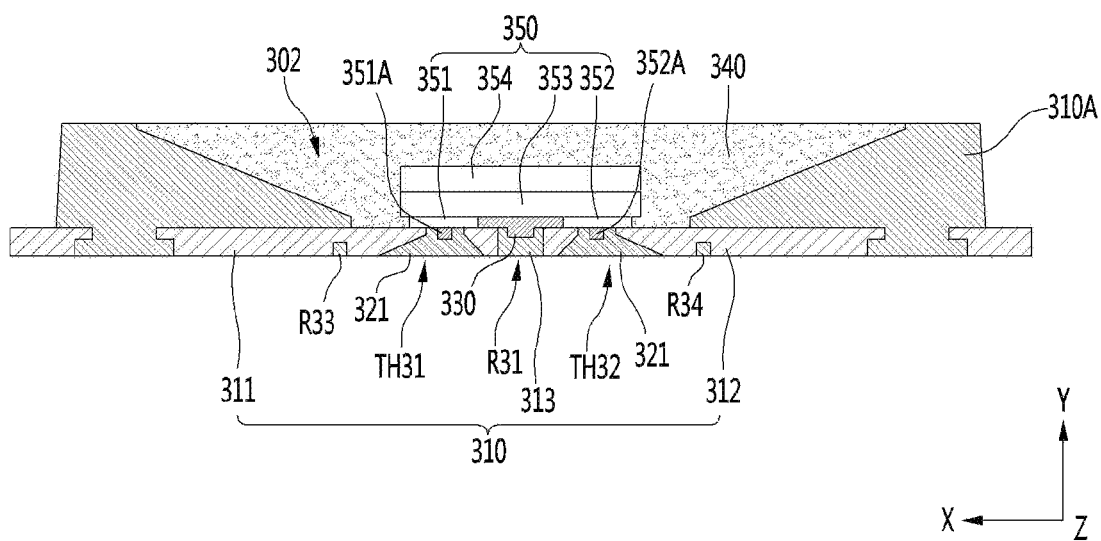
FIG. 4 is a view illustrating an example in which a part of a light emitting device is inserted into a through hole in the light emitting device package of FIG. 3.

As shown in FIGS. 3 and 4, the first resin 330 may overlap the light emitting device 350 in the vertical direction on the body 313. For example, the first resin 330 may include at least one of an epoxy-based, silicone-based, and hybrid-based material including an epoxy-based and silicone-based material. The first resin 330 may be a white silicone material, or may include at least one of TiO2, SiO2, and Al2O3 inside the silicon material. The first resin 330 may be adhered to the light emitting device 350 and the body 313. The first resin 330 may be adhered between the first bonding portion 351 and the second bonding portion 352 of the light emitting device 350. When bonding the bonding portions 351 and 352 of the light emitting device 350 or when bonding on a circuit board, the first resin 330 may prevent the light emitting device 350 from being tilted.

The light emitting device package 300 may include at least two through holes. The first frame 311 may include a first through hole TH31 and the second frame 312 may include the second through hole TH32. Each of the first and second through holes TH31 and TH32 may penetrate through the upper and lower surfaces of the first and second frames 311 and 312, and may be provided in one or more. The first and second through holes TH31 and TH32 may be spaced apart from the body 313 in the horizontal direction, may overlap the light emitting device 350 in the vertical direction, and may face the first and second bonding portions 351 and 352. The first and second bonding portions 351 and 352 are exposed through the first and second through holes TH31 and TH32 and may be connected to the electrical path and the heat dissipation path through the conductive portions 321 disposed in the first and second through holes TH31 and TH32.

Figure 2:
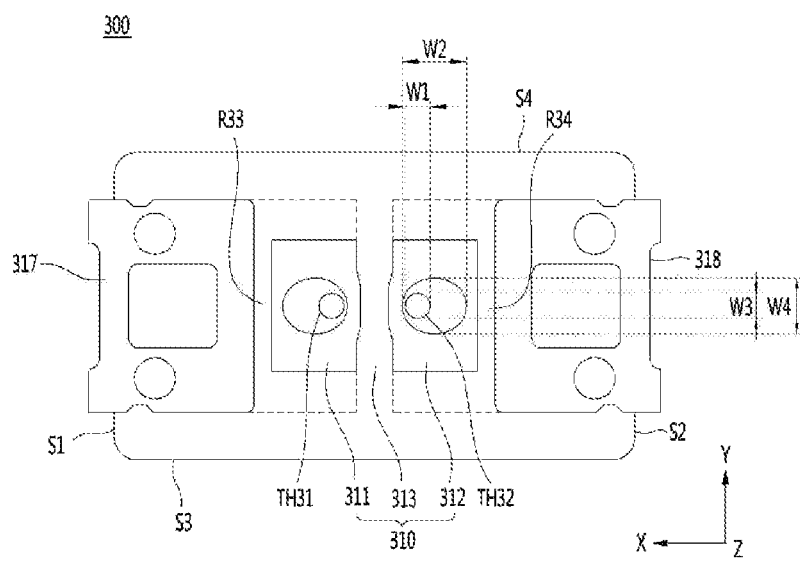
FIG. 2 is a bottom view of the light emitting device package of FIG. 1.

As shown in FIGS. 1 and 2, a top view shape or an upper shape of the first and second through holes TH31 and TH32 may be the same shape or a different shape from each other, for example, a circular shape, an elliptical shape, or a polygonal shape. The top and lower surfaces of the first and second through holes TH31 and TH32 may be different from each other, for example, may be formed in a non-symmetrical shape. The first and second through holes TH31 and TH32 may have a lower surface area greater than an upper surface area.

Figure 6:
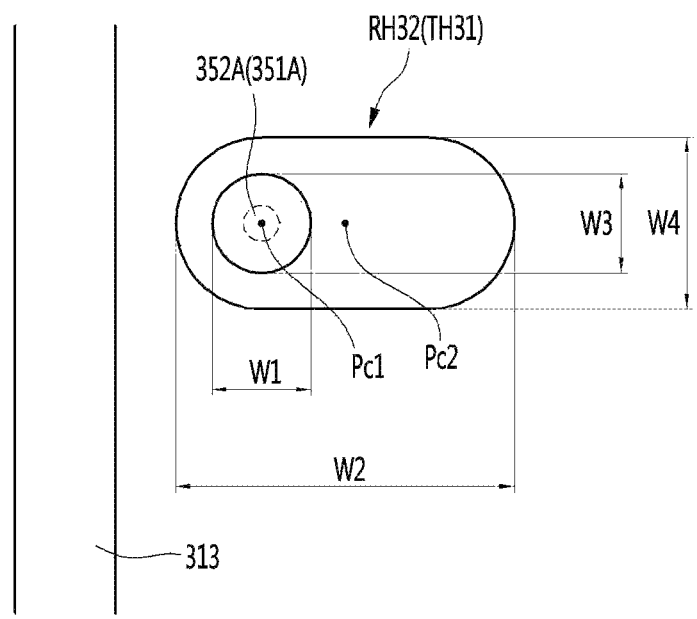
FIG. 6 is a view showing the shape of a through hole in the lower surface of the frame according to the embodiment.
Figure 7:
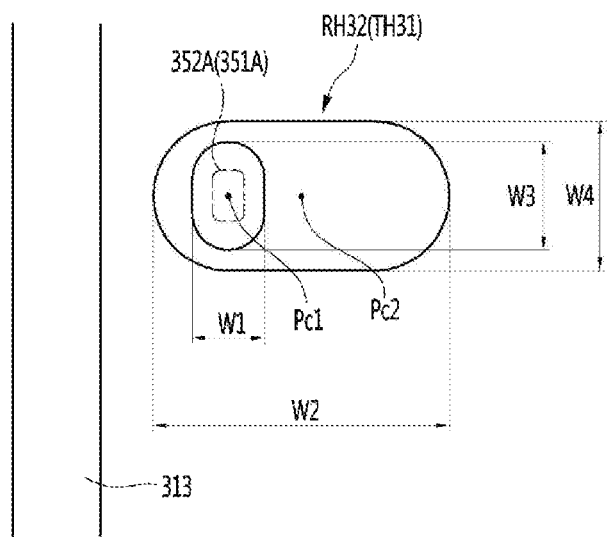
FIGS. 7 and 8 are views showing another example of the through hole of FIG. 6.
Figure 8:
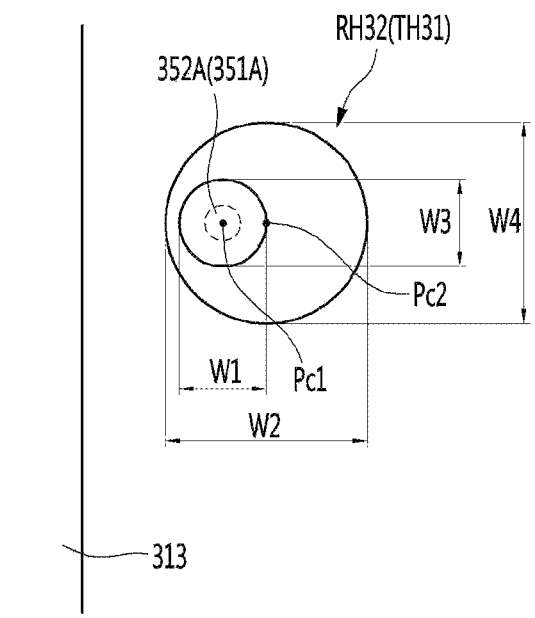

As shown in FIGS. 6 to 8, the center Pc1 of the upper surface of each of the through holes TH31 and TH32 and the center Pc2 of the lower surface may be arranged to be offset from each other. In the first through hole TH31, the center Pc1 of the upper surface is disposed closer to the second frame 312 or the second side surface S2 than the center Pc2 of the lower surface, and the center Pc2 of the lower surface is disposed closer to the second frame 312 or the second side surface S2 than the center Pc1 of the upper surface. In the second through hole TH32, the center Pc1 of the upper surface is disposed closer to the first frame 311 or the first side surface S1 than the center Pc2 of the lower surface, and the center Pc2 of the lower surface is disposed closer to the first frame 311 or the first side surface S1 than the center Pc1 of the upper surface. Here, the centers of the upper surface of each of the through holes TH31 and TH32 may be a point at which the longest virtual straight lines intersect in each direction by connecting the point forming the outer line from the upper surface of each of the through holes TH31 and TH32 in the direction intersecting each other. For example, the centers of the upper surface of each of the through holes TH31 and TH32 may be a point where the longest virtual straight lines intersect in the first and second directions. The center of the upper surface of each of the through holes TH31 and TH32 may be the center of gravity of the upper surface. Here, the centers of the lower surfaces of each of the through holes TH31 and TH32 may be a points at which the longest virtual straight lines intersect in each direction by connecting the point forming the outer line from the lower surface of each of the through holes TH31 and TH32 in the direction intersecting each other. For example, the center of the lower surface of each through hole TH31 and TH32 may be a point where the longest virtual straight lines intersect in the first and second directions. The center of the lower surface of each of the through holes TH31 and TH32 may be the center of gravity of the lower surface.

In each of the through holes TH31 and TH32, when the upper width is W1 and the lower width is W2 in the first direction, and the upper width is W3 and the lower width is W4 in the second direction, there are the relationship of W1<W2, and the relationship of W3<W4. There are the relationship of W1=W2<W4<W2. Here, the ratio of W1:W2 may have a ratio of 1:1.5 to 1:2.4, and the ratio of W3:W4 may have a ratio of 1:1.2 to 1:1.6. Since the lower widths of the first and second directions of each of the through holes TH31 and TH32 are arranged larger than the upper width, the conductive portions 321 filled or inserted into the through holes TH31 and TH32 may be filled with a higher density, thereby improving the electrical conductivity efficiency and suppressing cracking of the conductive material. The conductive material may be defined as the conductive portion 321 or/and conductive protrusions. The upper area of each of the through holes TH31 and TH32 may have a range of 30% or more, for example, 30% to 98% of the lower surface area of the bonding portions 351 and 352. The width W1 in the first direction at the upper portion of each of the through holes TH31 and TH32 may have a difference of 5 μm or less than the width W3 in the second direction. The width W4 in the second direction at the lower portion of each of the through holes TH31 and TH32 may be wider 50 μm or more than the width W3 in the second direction at the upper portion of the through holes THE1 and TH32. For example, the width W4 of the lower portion may be wider in the range of 50 to 150 μm than the width W3 of the upper portion. The width W2 of the lower portion in the first direction may be 100 μm or more wider than the width W4 of the lower portion in the second direction. The difference between the width W2 of the lower portion in the first direction and the width W4 of the lower portion in the second direction may be 100 μm or more. Each of the through holes TH31 and TH32 may have the width W2 of 400 μm or more on the lower portion in the first direction, for example, in the range of 400 to 600 μm, or in the range of 450 to 600 μm. The width W4 in the second direction at the lower portion of each of the through holes TH31 and TH32 may be 300 μm or more, for example, in a range of 300 to 400 μm. By forming the lower shape of each of the through holes TH31 and TH32 asymmetrically large with respect to the upper shape, the amount of the conductive portion 321 filled from the lower portion of the through holes TH31 and TH32 toward the upper direction may be increased. The depth of each of the through holes TH31 and TH32 may be the same as the thickness of the frames 311 and 312. Each of the through holes TH31 and TH32 may gradually have a wider width from the upper portion to the lower portion. Each of the through holes TH31 and TH32 may have a larger ratio in which the width increases in the first direction from the upper portion to the lower portion than the ratio in which the width increases in the second direction.

Figure 5:
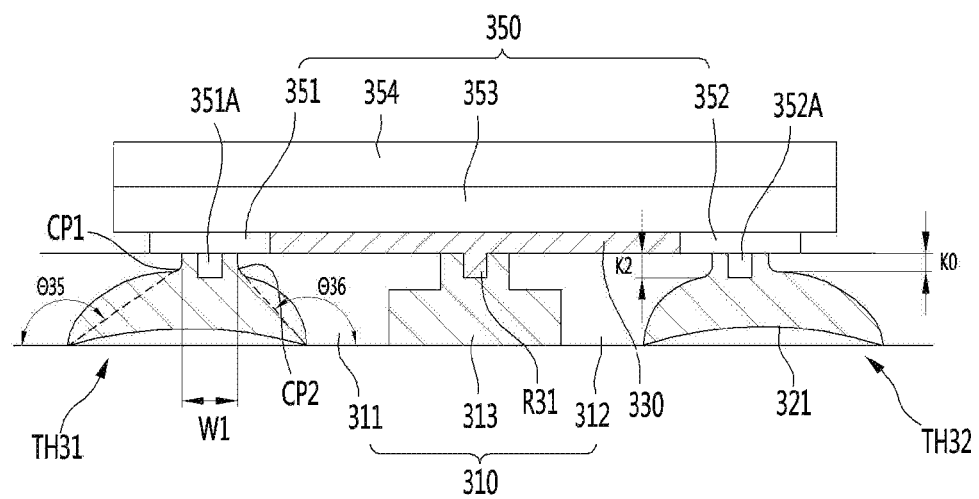
FIG. 5 is a view showing a detailed structure of a through hole of a frame according to an embodiment.

As shown in FIG. 5, the inner side of each of the through holes TH31 and TH32 may include at least two or more of a vertical surface, an inclined surface, a convex curved surface, or a concave curved surface. As another example, the inner side of each of the through holes TH31 and TH32 may have a convex curved surface and a concave curved surface, or may have an inflection point between the concave curved surface and the convex curved surface. In each of the through holes TH31 and TH32, the inflection point or the upper and lower boundary points CP1 and CP2 (see FIG. 5) may be closer to the upper surfaces than the lower surfaces of the frames 311 and 312. Roughness may be disposed on the inner side of each of the through holes TH31 and TH32 on a convex curved surface.

The thickness k0 of the frames 311 and 312 may be 180 μm or more, for example, in a range of 180 to 300 μm. When the thickness k0 of the frames 311 and 312 is larger than the above range, the package thickness may increase, and when it is smaller than the above range, heat dissipation efficiency may decrease. When the thicknesses of the frames 311 and 312 are k0, the upper thickness k2 of the inner region of each through hole TH31 and TH32 may be thicker than the upper thickness k1 of the outer region. The inner region of each of the through holes TH31 and TH32 may be a region closer to the body 315. In the frames 311 and 312, the inner region of each through hole TH31 and TH32 may have an upper thickness k2 of 0.4 times or less, for example, in a range of 0.3 to 0.4 times the thickness k0 of each frame 311 and 312. In the frames 311 and 312, the outer region of each through hole TH31 and TH32 has an upper thickness k1 of 0.45 times or less, for example, in a range of 0.35 times to 0.45 times the thickness k0 of the first and second frames 311 and 312. In each of the through holes TH31 and TH32, the upper thickness k1 of the outer region may be less than 100 μm. The difference between the upper thickness k1 of the outer region and the upper thickness k2 of the inner region in each of the through holes TH31 and TH32 may be 10 μm or more, for example, in a range of 10 to 40 μm. In each of the through holes TH31 and TH32, the inner region and the outer region may be the boundary points CP1 and CP2, and the thickness may be a distance from the boundary points CP1 and CP2 to the upper surface of the frame. Here, since the upper thickness k1<k2 of the outer region in each of the through holes TH31 and TH32 is thinner, the lower width of each of the through holes TH31 and TH32 may be provided wider. The lower shape of each of the through holes TH31 and TH32 may be formed in a non-symmetrical shape, so that when each of the through holes TH31 and TH32 is filled with a conductive portion 321, and the conductive portion 321 may be filled with a higher density or more content and may be harden.

The straight line connecting the boundary points CP1 and CP2 of each of the through holes TH31 and TH32 and both lower ends of the through holes TH31 and TH32 may be formed in the first and second angles θ35 and θ36 from the horizontal straight line on the lower surface of the body. The first angle θ35 of the straight line extending from the inflection point of the outer region in the through holes TH31 and TH32 may be greater than the second angle θ36 of the straight line extending from the inflection point of the inner region. Here, in the method of forming the through hole in the frame, the injection pressure of the etching liquid at the lower portion of the through hole may be larger than the injection pressure of the etching liquid at the upper portion, thereby increasing the etching area of the lower portion of the through hole.

As shown in FIGS. 1 and 4, the recesses R31 and R32 may be provided in one or more on the upper portion of the body 313, and may be concave in the lower surface direction from the upper surface of the body 313. The recesses R31 and R32 may be disposed between the first and second through holes TH31 and TH32 or between the first and second frames 311 and 312. The recesses R31 and R32 may include first and second recesses R31 and R32, and at least some or all of the first and second recesses R31 and R32 may include the light emitting device 350 in the vertical direction. The first and second recesses R31 and R32 may not overlap with the first and second through holes TH31 and TH32 in the first direction, thereby serving as a dam for the leakage the first resin 330. The first and second recesses R31 and R32 may include an inner portion overlapping the light emitting device 350 and an outer portion protruding outwardly from the light emitting device 350. The ratio of the inner portion to the outer portion of the first and second recesses R31 and R32 may be in the range of 4:6 to 6:4, and light loss at the lower portion of the light emitting device 350 may be reduced. As another example, the recesses R31 and R32 of the body 313 alleviate thermal deformation of the body in the first direction to suppress cracking of the conductive paste.

When the depths of the recesses R31 and R32 are t1 and the depths of the through holes TH31 and TH32 are t2, for example, the difference t2−t1 of the depths t2 and t1 may be selected at least 150 μm or more. The thickness of the body 313 may be provided with a thickness in consideration of crack free. The depth t2 may be provided in a range of 2.5 to 12 times compared to the depth t1. For example, when the depth of t2 is provided as 200 μm, the depth of t1 may be provided as 20 μm to 100 μm.

The recesses R31 and R32 and the first resin 330 may enhance adhesion of the light emitting device 350. The first resin 330 may diffuse or reflect the incident light. The width of the recesses R31 and R32 in the first direction may be provided narrower than the distance between the first bonding portion 351 and the second bonding portion 352, and 140 μm or more, for example, in a range of 140 to 160 μm. The length of the recesses R31 and R32 in the second direction may be smaller than the length of the light emitting device 350 in the second direction. The recesses R31 and R32 may have a top view shape in a polygonal shape, a circle shape, or an ellipse shape. The recesses R31 and R32 may have a side cross-sectional shape of a polygonal shape or a curved shape. Each of the recesses R31 and R32 may have an upper width wider than a lower width in the first and second directions. The recesses R31 and R32 may be provided with an inclined surface inside, to guide the first resin 330. As another example, the recesses R31 and R32 may be removed on the body 313.

The frames 311 and 312 and the bonding portions 351 and 352 may be combined by an intermetallic compound layer. The intermetallic compound may include at least one of $Cu_xSn_y$, $Ag_xSn_y$, and $Au_xSn_y$, and the x may satisfy the conditions of $0<x<1$, $y=1-x$, and $x>y$.

As shown in FIGS. 4 and 5, the conductive portion 321 may be disposed in the first and second through holes TH31 and TH32. The conductive portion 321 disposed in the first through hole TH31 may contact the lower surface of the first bonding portion 351 and the first frame 311. The conductive portion 321 disposed in the second through hole TH32 may contact the lower surface of the second bonding portion 352 and the second frame 312. The conductive portions 321 disposed in the first and second through holes TH31 and TH32 may be filled in a range of 30% or more, for example, in a range of 30% to 300% of the volume of the through holes TH31 and TH32, when it is smaller than the above range, electrical reliability may be deteriorated, and when it is larger than the above range, the bonding force with the circuit board may be lowered due to protrusion of the conductive portion. The conductive portion 321 may include one material selected from Ag, Au, Pt, Sn, Cu, Zn, In, Bi, Ti, or an alloy thereof. The conductive portion 321 is a solder paste, and may be formed by mixing powder particles or particle particles and flux. The solder paste may include Sn—Ag—Cu, and the weight percentage of each metal may vary. For example, the conductive portion 321 may be formed of a solder paste or a conductive paste having a silver paste, or may be formed of a multilayer or alloy composed of different materials. An alloy layer may be formed between the conductive portion 321 and the frames 311 and 312, and the alloy layer may include an intermetallic compound layer having at least one of AgSn, CuSn, and AuSn. The bonding portions 351 and 352 of the light emitting device 350 may be formed an intermetallic compound (IMC) layer between the conductive portion 321 and the frames 311 and 312 by a forming process of the conductive portion 322 or heat treatment process after the conductive portion 321 is provided and the material constituting the conductive portion 321.

The first and second through holes TH31 and TH32 may include voids on a boundary surface with the conductive portion 321. When the conductive portion 321 is filled, the voids may be generated at an interface between other frames or bonding portions. Since the filling amount of the conductive portion is increased by the shape of the first and second through holes, generation of voids may be suppressed or eliminated, so that cracking of the conductive portion may be prevented, and electrical and thermal conductivity efficiency may be improved.

As shown in FIGS. 2 to 4, lower recesses R33 and R33 may be disposed under the first and second frames 311 and 312. The lower recesses R33 and R34 may be combined with a part of the body 313 at the lower periphery of the first and second through holes TH31 and TH32.

As shown in FIG. 4, the light emitting device 350 includes first and second conductive protrusions 351A and 352A at the lower portion thereof, and the first and second conductive protrusions 351A and 352A are the first and second conductive protrusions. The bonding portions 351 and 352 may extend in a lower surface direction of the body, and may be disposed in the first and second through holes TH31 and TH32. The first and second conductive protrusions 351A and 352A may be formed of a metal material, and include, for example, at least one material selected from Ag, Au, Cu, Ti, and Ni, and may be formed in a single layer or multiple layers. The first and second conductive protrusions 351A and 352A may include a seed layer. The seed layer has, for example, at least one of Ti, Ni, and Cu, and may be formed in a single layer or multiple layers. The first and second conductive protrusions 351A and 352A may include metal pillars protruding on the seed layer, and the metal pillars may include at least one of Cu, Au, and Ag. The metal pillar may have a bottom view shape of a circular pillar or a polygonal pillar shape. The distance between the first and second conductive protrusions 351A and 352A may be wider than the minimum distance between the first and second through holes TH31 and TH32. The first and second conductive protrusions 351A and 352A have a bottom area smaller than the bottom area of the first and second bonding portions 351 and 352, and may be connected to the conductive portion 321 disposed in the first and second through holes TH31 and TH32. The first bonding portion 351, the first conductive protrusion 351A, the conductive portion 321, and the first frame 311 may be partially combined. The second bonding portion 352, the second conductive protrusion 352A, the conductive portion 321, and the second frame 312 may be partially combined. The first and second conductive protrusions 351A and 352A may be suppressed generation and diffusion of cracks in the conductive portion 321 by thermal deformation at an interface between the conductive portion 321 and the first and second bonding portions 351 and 352. The first and second conductive protrusions 351A and 352A are 5% or more, for example, in a range of 5% to 40% of the depth of the first and second through holes TH31 and TH32 from the upper surfaces of the first and second through holes TH31 and TH32.

FIG. 6 is an example of a through hole, the through holes TH31 and TH32 have an upper shape having a circular shape, a lower or bottom shape having an elliptical shape having a long length in the first direction, or a corner having a polygonal shape having a curved shape. Since the through holes TH31 and TH32 are formed away from the body 313 relative to the body 313, the area of the lower or bottom shape is formed to be wider, so that the bonding area of the conductive portion or the amount of filling may be increased. As shown in FIG. 7, the through holes TH31 and TH32 have an elliptical shape with an upper shape having a long length in the second direction, an elliptical shape with a lower shape having a long length in the first direction, or a shape having a curved both side of a rectangular shape. That is, the upper shape and the lower shape of the through holes TH31 and TH32 may be arranged in a direction in which the long shapes are orthogonal to each other. In this case, the shape of the conductive protrusions 351A and 352A disposed in the through holes TH31 and TH32 may be formed to have a long length in the second direction. As shown in FIG. 8, the through holes TH31 and TH32 may have a circular shape with an upper shape and a lower shape with a diameter larger than the diameter of the upper shape. As shown in FIGS. 6 to 8, the relationship between the widths W1 and W2 in the first direction and the widths W3 and W4 in the second direction will be referred to the description disclosed above. A conductive portion is disposed in the through holes TH31 and TH32, and may be combined with conductive protrusions 351A and 352A.

In the reflow process, re-melting phenomenon in the bonding region between the frame and the light emitting device provided in the light emitting device package may be suppressed from occurring. That is, the melting point of the conductive portion may be provided at a higher value than the melting point of other bonding materials. Therefore, when the light emitting device package on the main substrate is bonded through a reflow process, re-melting phenomenon in the periphery of the light emitting device is suppressed, and electrical connection and deterioration of physical bonding force may be prevented. Therefore, damage or discoloration of the package body 310 may be prevented.

As shown in FIG. 2, the molding part 340 is formed of a light-transmitting material, and may be disposed on the light emitting device 350 and the first and second frames 311 and 312. The molding part 340 may be disposed in the cavity 302. The molding part 340 may include at least one of phosphors or quantum dots, and may emit wavelength-converted light. The light emitting device 350 may emit light of blue, green, red, white, infrared, or ultraviolet light. The molding part 340 may not be formed.

Figure 9:
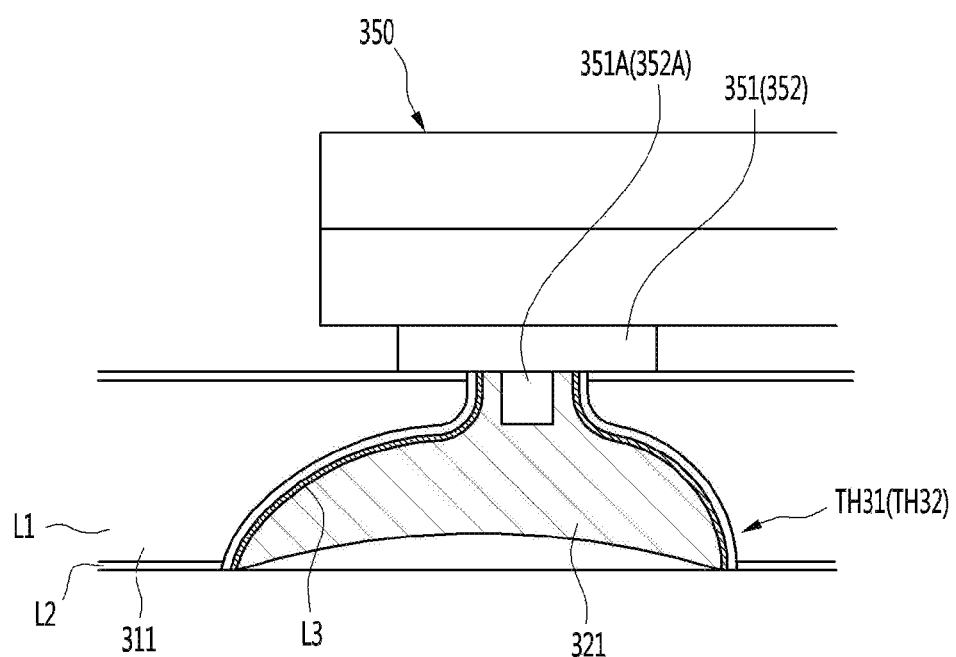
FIG. 9 is a view illustrating a detailed structure disposed in a through hole in a multi-layered frame in FIG. 5.

Referring to FIG. 9, the frames 311 and 312 include first and second metal layers L1 and L2, and the first metal layer L1 is a base layer, may include Cu, Ni, and Ti, and may be formed in a single layer or multiple layers. The second metal layer L2 may include at least one of Au, Ni, and Ag layers, and the Ni layer has a small change in thermal expansion, and the Ag layer efficiently may reflect light emitted and may improve light intensity, the Au layer may improve the bonding strength and the reflection efficiency of the bonding portion 351 and 352.

The conductive portion 321 may be filled within 100% or less in the through holes TH31 and TH32, for example, may be filled in a range of 30% to 100%, and when it exceeds the above range, the bonding force with the circuit board may be degraded, and when it is smaller than the above range, the conductive properties may be lowered. The alloy layer L3 may be formed between the conductive portions 321 and the frames 311 and 312 by bonding between two materials. The alloy layer L3 may include an intermetallic compound layer having at least one selected from AgSn, CuSn, and AuSn.

Figure 10A:
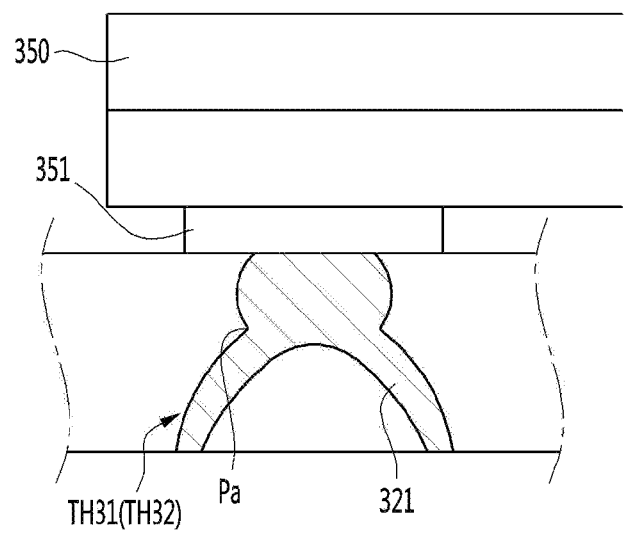
FIG. 10A is a view illustrating an example when a symmetrical through hole is formed in the frame.
Figure 10B:
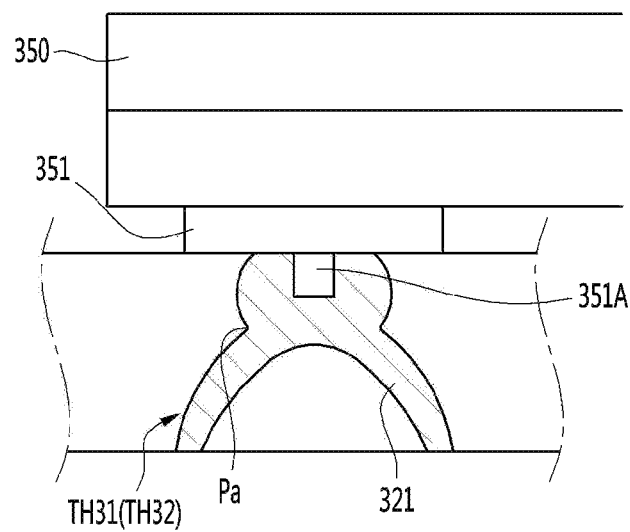
FIG. 10B is a conductive protrusion of the light emitting device is coupled to the symmetrical through hole in the frame.

As shown in (a) of FIG. 10, when the convex portion Pa between the upper and lower portions of the through holes TH31 and TH32 protrudes in the inner direction of the hole, in the injection process of the conductive portion 321, the injection efficiency may be reduced by being caught by the convex portion Pa, and the void area may be increased at the upper portion of the hole. Accordingly, cracks due to thermal deformation may occur at the interface between the bonding portion 351 and the conductive portion 321, and the electrical conductivity may be lowered. As shown in (b) of FIG. 10, even if the conductive protrusion 351A of the light emitting device is coupled to the through hole 351, it is difficult to fill the conductive portion 321 between the conductive protrusion 351A and the through hole 351. The void area is not reduced, and cracks may occur in the conductive portion or reliability due to voids may be reduced.

Figure 11:
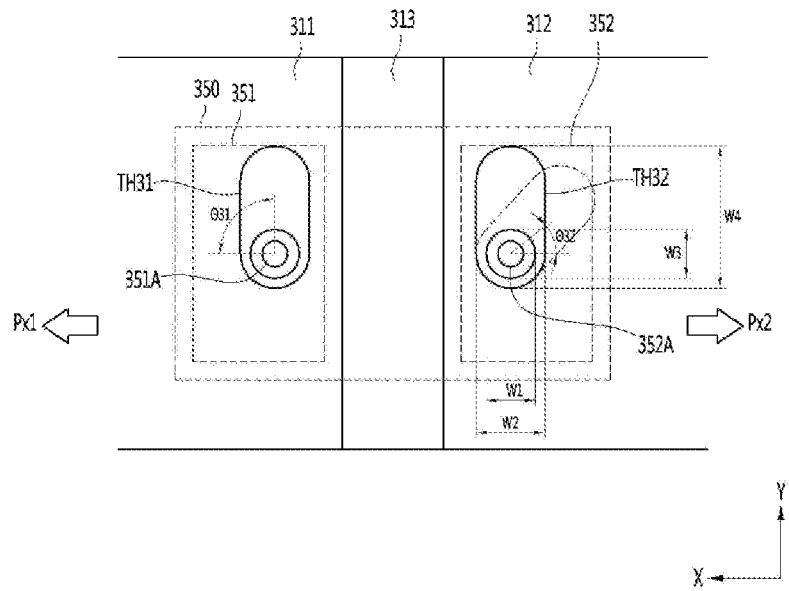
FIGS. 11 and 12 are views showing another form of a through hole of a frame according to an embodiment of the present invention.
Figure 12:
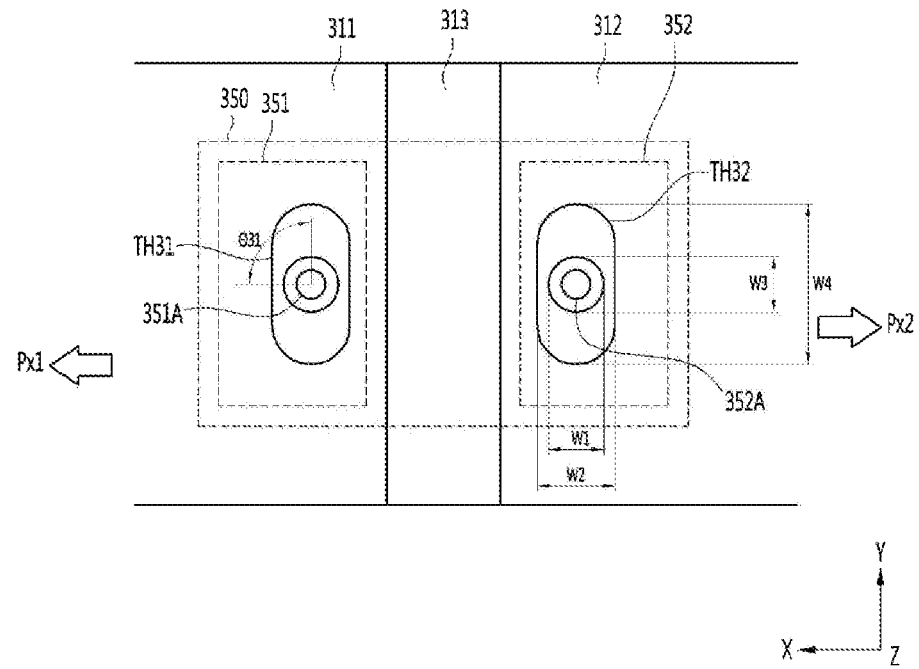

Referring to FIG. 11, since the through holes TH31 and TH32 transfer heat in the first direction, when the lower width is increased in the first direction, the heat transfer efficiency in the heat transfer directions Px1 and Px2 may be degraded. Accordingly, the lower widths of the through holes TH31 and TH32 may be provided more widely in the second direction orthogonal to the first direction. The extending direction from the lower portion of the through holes TH31 and TH32 to the second direction may be formed in a direction perpendicular angle θ31 to the first direction, or may be shifted in an angle θ32 of 30 to 60 degrees. Accordingly, it is possible to prevent the heat transfer efficiency of the frame in the first direction from being lowered. Referring to FIG. 12, the center of the upper surface of the through holes TH31 and TH32 and the center of the lower surface may be at the same center. Accordingly, it is possible to prevent the heat transfer efficiency of the frame in the first direction from being lowered, and the conductive portions 321 may be filled or contacted with a uniform distribution by through holes TH31 and TH32 having the same center.

Second Embodiment

FIGS. 13 to 17 are views illustrating a light emitting device package according to a second embodiment. In the description of the second embodiment, the same configuration as the first embodiment may be selectively applied with reference to the first embodiment.

Referring to FIGS. 13 to 17, the light emitting device package 100 includes a plurality of frames 120, 130, 135, 140, a body 115, and a plurality of light emitting devices 151, 152, 153. The plurality of light emitting devices 151, 152, and 153 may be arranged to be individually driven, or may be connected to be driven in series or in parallel, and may include one or more light emitting cells. The length of the first direction in the light emitting device package 100 may be 2.5 mm or more, for example, in a range of 2.5 to 7 mm, and the length of the second direction may be equal to or greater than the length of the first direction. The body 115 is disposed between the first to fourth frames 120, 130, 135, and 140 to be coupled to and supported by the first to fourth frames 120, 130, 135, and 140.

The second frame 130 may be disposed between the first and third frames 120 and 135, and the third frame 135 may be disposed between the second and fourth frames 120 and 140. One, two or three or more frames may be disposed between the first and fourth frames 120 and 140, and may vary depending on the number of light emitting devices. At least one or two or more of the frames 120, 130, 135, and 140 may include at least one through hole. At least one of the frames 120, 130, 135, and 140 may have a plurality of through holes. The first frame 120 includes a first through hole TH1, and the second frame 120 includes second and third through holes TH2, TH3, and the third frame 135 may include fourth and fifth through holes TH4 and TH5, and the fourth frame 140 may include a sixth through hole TH6.

The first frame 120 overlaps a portion of the first light emitting device 151 in a vertical direction, and the fourth frame 140 may be overlapped a portion of the third light emitting device 153 in a vertical direction. The first extension portion 123 of the first frame 120 and the second extension portion 143 of the fourth frame 140 may protruded toward the outside of the first side surface S1 and the second side surface S2 of the package body 110A. The first and second extension portions 123 and 143 may be provided with a Y-direction length equal to or greater than ½ of the Y-direction length of the package body 110A, thereby enhancing heat dissipation efficiency and bonding strength. The width of the region protruding from the first and second extension portions 123 and 143 may be at least 100 μm in the X direction.

The second frame 130 may include first and second frame portions 131 and 132 and a first connection frame portion 133 connecting the first and second frame portions 131 and 132. The first frame portion 131 may correspond to the first frame 120 in the Y direction, and the second frame portion 132 may correspond to the first frame 120 in the X direction. The first connection frame portion 133 may be disposed between the first frame 120 and the third frame portion 136 of the third frame 135. The first frame portion 131 and the first frame 120 may be disposed under the first light emitting device 151 and electrically connected to the first light emitting device 151. The second frame 130 may connect the first light emitting device 151 and the second light emitting device 152 in series. The third frame 135 may include third and fourth frame portions 136 and 137 and a second connection frame portion 138 connecting the third and fourth frame portions 136 and 137. The second connection frame portion 138 may be disposed between the second frame portion 132 and the fourth frame 140 of the second frame 130. The third frame portion 136 and the second frame portion 132 of the second frame 130 may be disposed under the second light emitting device 152 and electrically connected to the second light emitting device 152. The fourth frame portion 137 and the fourth frame 140 are disposed under the third light emitting device 153 and may be electrically connected to the third light emitting device 153. The third frame 135 may connect the second light emitting device 152 and the third light emitting device 153 in series.

The connection region between the second and third through holes TH2 and TH3 is the first connection frame portion 133, and the connection region between the fourth and fifth through holes TH4 and TH5 is the second connection frame portion 138. When the minimum widths of the first and second connecting frame portions 133 and 138 is greater than the maximum widths of the lower surface of the through holes TH1-TH6, interference with adjacent recesses may occur and a formation of the through holes TH1-TH6 may be difficult. The first and second connection frame portions 133 and 138 may be exposed on the lower surface of the body 115. As another example, the first and second connection frame portions 133 and 138 may be spaced apart from the lower surface of the body 115. The first and second connecting frame portions 133 and 138 may have a thickness smaller than the depth of the through holes TH1-TH6 in the vertical direction or a thickness smaller than the thickness of the frames 120, 130, 135, and 140. Each of the frames 120, 130, 135, and 140 may have one or a plurality of protrusions protruding from the third side surface S3 and the fourth side surface S4 and coupled with the body 115. The second and third frames 130 and 135 may have the same shape. Each of the first to fourth frames 120, 130, 135, and 140 may include an upper recess R51 or a stepped structure on the upper portion. The depth of the upper recess R51 may be in the range of 40% to 60% of the thickness of the frames 120,130,135 and 140, it may be formed in a range that may prevent and support the strength degradation of the frames 120,130,135, and 140.

In each of the frames 120, 130, 135, and 140, the upper region overlapping the region of the through hole TH1-TH6 may have a minimum distance D4 from the upper recess R51 of 80 µm or more, for example, in a range of 80 to 150 µm. Accordingly, the rigidity of the frame portion in contact with the body 115 can be secured, and when forming and injecting through holes TH1-TH6, it is possible to prevent damage to the rigidity of the frame by a stepped structure or recess.

The second through hole TH2 may be disposed in the first frame portion 131 of the second frame 130, and the third through hole TH3 may be disposed in the second frame portion 132 of the second frame 130, and the fourth The through hole TH4 may be disposed in the third frame portion 136 of the third frame 135 and the fifth through hole TH5 may be disposed in the fourth frame portion 137 of the third frame 135. The first and second through holes TH1 and TH2, the third and fourth through holes TH3 and TH4, and the fifth and six through holes TH5 and TH6 may overlap each of the bonding portions 51 and 52 of the first to third light emitting devices 151, 152, and 153 in a vertical direction. When the conductive protrusions 51A and 52A of the light emitting devices 151, 152 and 153 are inserted into each of the through holes TH1-TH6, the conductive protrusions 51A and 52A may be combined to the conductive portion 321 and may suppress crack generation of the conductive portion 321 or may increase the crack path. Detailed configuration of the through holes TH1-TH6, the conductive portion 321, and the conductive protrusions 51A, 52A will be selectively applied to the description or configuration of the embodiment (s). The first through hole TH1 and the sixth through hole TH6 may be spaced apart in a diagonal direction, and may be spaced up to a maximum length among the intervals between the through holes TH1-TH6. The total number of through holes TH1-TH6 may be twice the number of the light emitting devices 151, 152, 153. The upper area of each through hole TH1-TH6 may have a range of 30% or more, for example, in a range of 30% to 98% of the lower surface area of each of the bonding portions 51 and 52. The inner side of the through hole TH1-TH6, the configuration of the conductive portion 321 and the conductive protrusions 51A, 52A will be selectively referred to the description or configuration of the embodiment(s). The driving voltage supplied to the light emitting device package may be increased in proportion to the number of light emitting cells in the light emitting devices 151, 152, and 153, and may be supplied at a high voltage. The high voltage light emitting device package may be adjusted dimming, so that the brightness of the emitted light can be adjusted.

Figure 13:
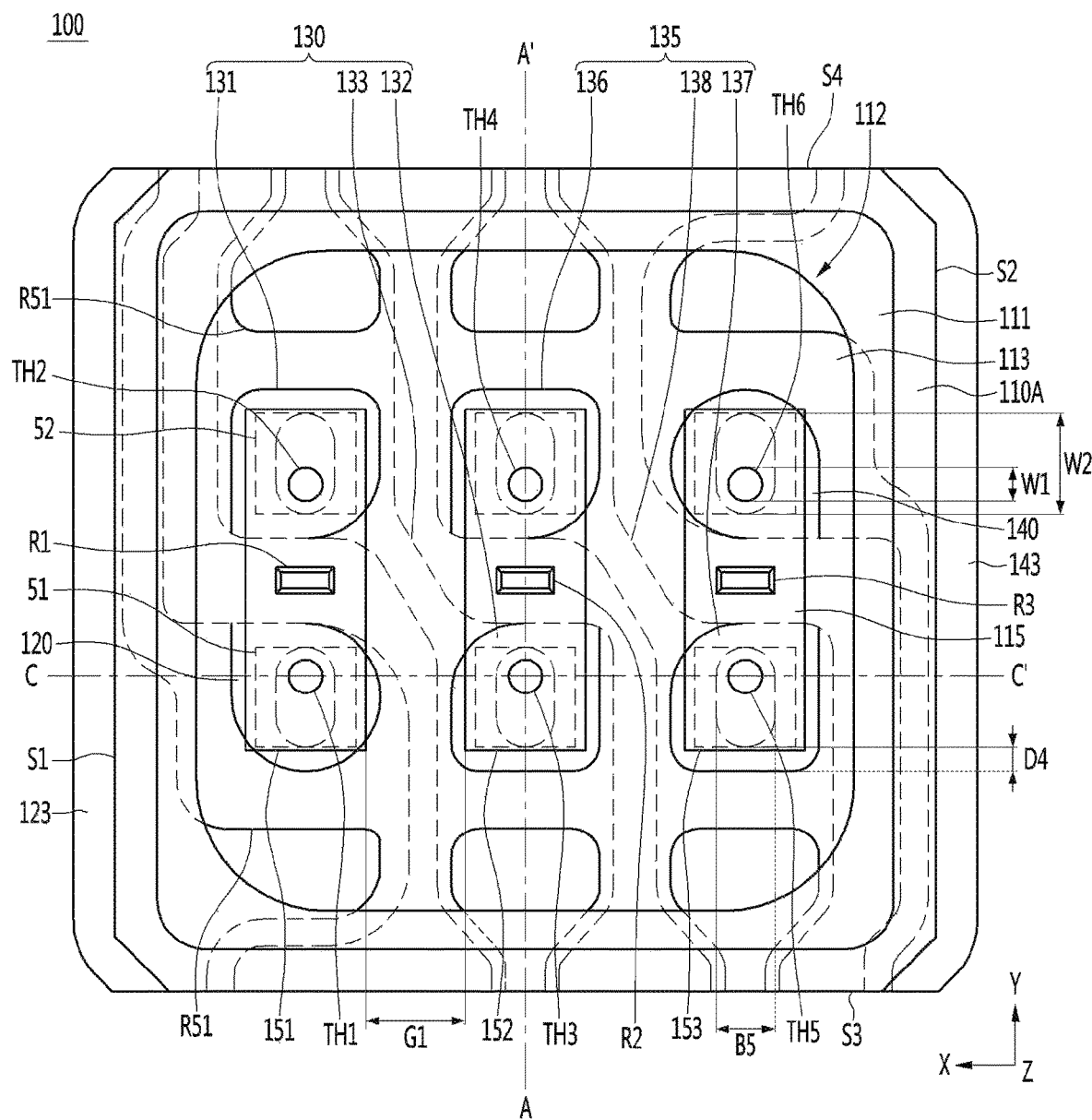
FIG. 13 is a plan view of a light emitting device package according to a second embodiment of the present invention.
Figure 14:
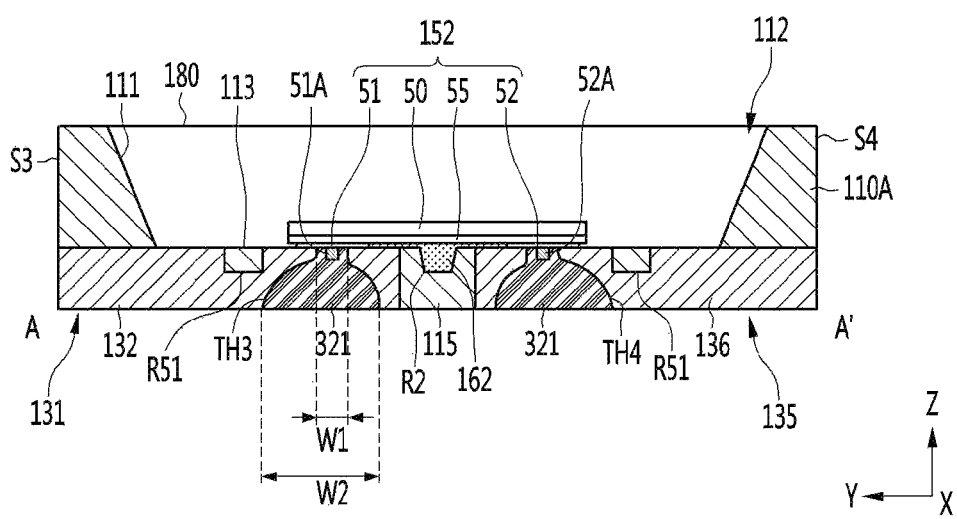
FIG. 14 is a cross-sectional view taken along line A-A' side of the light emitting device package of FIG. 13.
Figure 15:
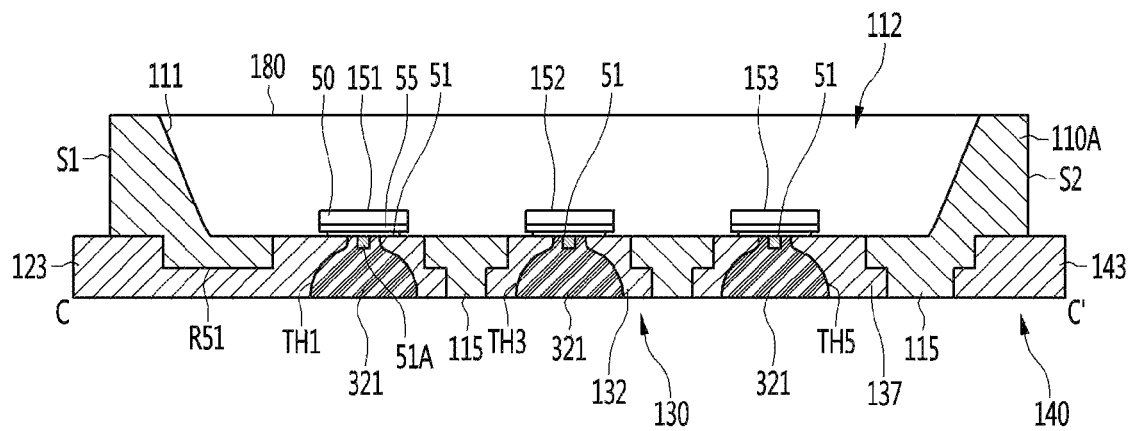
FIG. 15 is a cross-sectional view taken along the line C-C' side of the light emitting device package of FIG. 13.

As shown in FIGS. 13 to 15, the plurality of recesses R1, R2, and R3 may be arranged in a first direction on the upper portion of the body 115 or in a direction in which the light emitting devices 151, 152, and 153 are arranged. The first recess R1 is disposed between the first frame 120 and the first frame portion 131 of the second frame 130, and the second recess R2 may be disposed between the second frame portion 132 of the second frame 130 and the third frame portion 136 of the third frame 135. The third recess R3 may be disposed between the fourth frame portion 137 of the third frame 135 and the fourth frame 140. The first connection frame portion 133 is disposed between the first and second recesses R1 and R2, and the second connection frame portion 138 is disposed between the second and third recesses R2 and R3. The first recess R1 is disposed between the first and second through holes TH1 and TH2, and the second recess R2 is disposed between the third and fourth through holes TH3 and TH4, the third recess R3 may be disposed between the fifth and sixth through holes TH5 and TH6. The first recess R1 is disposed on an imaginary line having the shortest distance between the first through hole TH1 and the second through hole TH2, and extends in a direction perpendicular to the imaginary line. The length of the first recess R1 is the length of the direction in which the first recess R1 extends and may be smaller than the width of the light emitting devices 151, 152, and 153. The extension direction and length of the second and third recesses R2 and R3 will be referred to the description of the first recess R1.

Figure 17:
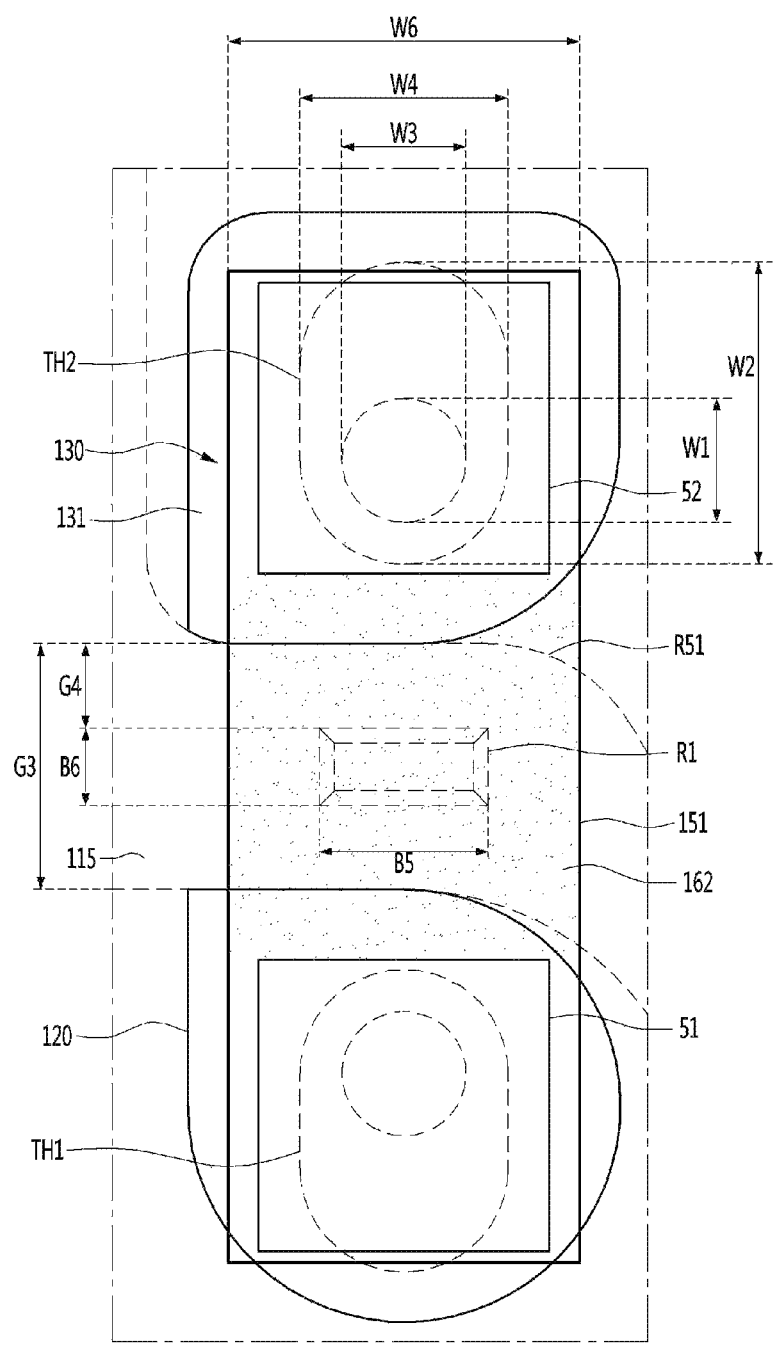
FIG. 17 is a view for explaining a relationship between a recess of the body, a bonding portion of the light emitting device, and a through hole of a frame disposed in the light emitting device package of FIG. 19.

Referring to FIGS. 13 and 17, the length B5 of each recess R1, R2, R3 in the first direction may be smaller than the width W6 of the light emitting devices 151,152, and 153. The length B5 of each recess R1, R2, and R3 may disposed smaller than the width W6 of the light emitting devices 151,152, and 153, thereby reducing light loss through the region of each recess R1, R2, and R3. The width B6 of each recess R1, R2, and R3 in the second direction may be smaller than the length B5 of the first direction. The width B6 may be smaller than the interval G3 between two adjacent frames in the Y direction, for example, may be disposed at 70% or less of the interval G3. The width B6 of each of the recesses R1, R2, and R3 may prevent deterioration of the rigidity of the body 115 and reduce light loss. As an example, the depth of the recesses R1, R2, and R3 will be referred to the description of the first embodiment. As shown in FIGS. 13 and 14, the interval between the recesses R1, R2 and R3 disposed under the different light emitting devices 151, 152 and 153 may be smaller than the interval G1 between the light emitting devices 151, 152 and 153. The first resin 160 is disposed between the body 115 and the light emitting devices 151, 152, 153, is in contact with the first and second bonding portions 51, 52, and may disposed in each recess R1, R2, and R3. The first resin 160 will be referred to the description of the first embodiment.

The lower surfaces of the first and second connecting frame portions 133 and 138 are disposed on the same plane as the lower surfaces of the second and third frames 130 and 135, and the upper surfaces of the first and second connecting frame portions 133 and 138 may be disposed lower height than the upper surfaces of the second and third frames 130 and 135. The first and second connection frame portions 133 and 138 may extend in a straight line shape, a curved shape, or an angled shape. The width of the first and second connection frame portions 133 and 138 may be smaller than the length of the first and second connection frame portions 133 and 138, for example, 120 µm or more, for example, in the range of 120 µm to 300 µm, or in the range of 150 µm to 250 µm. The lengths of the first and second connecting frame portions 133 and 138 are intervals between two adjacent frame portions, and may be 400 µm or more, for example, in the range of 400 µm to 600 µm. As another example, the first or/and second connection frame portions 133 and 138 may include an open region in the middle thereof, and the open region may be physically separated both ends of the first or/and second connection frame portions 133 and 138. When a conductive portion is provided in the open region, the separated first or second connection frame portions 138 may be connected to each other, and when there is no conductive portion, they may be electrically separated. Each of the first to third light emitting devices 151, 152, and 153 may emit the same peak wavelength or emit different peak wavelengths from each other. Each frame 120,130,135, and 140 and the bonding portions 51 and 52 of the light emitting devices 151,152, and 153 may form an intermetallic compound layer by a conductive portion.

Figure 16:
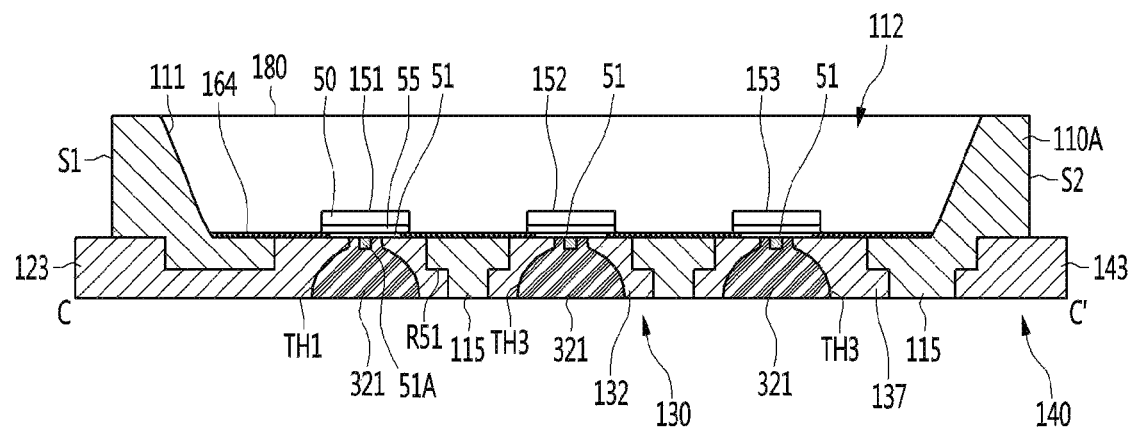
FIG. 16 is a modified example of the light emitting device package of FIG. 15.

As shown in FIG. 16, the second resin 164 is disposed on the first to fourth frames 120, 130, 135, and 140 and the body 115 around the lower periphery of the light emitting devices 151, 152, and 153, and may contact with the lower surface and the lateral surface of the light emitting devices 151, 152, and 153. The second resin 164 is disposed lower height than the lower surface of the light emitting structure 55 of the light emitting devices 151, 152 and 153 to reflect light emitted in the lateral direction from the light emitting devices 151, 152 and 153. The second resin 164 may include at least one of epoxy-based, silicon-based, and hybrid-based materials including epoxy-based and silicon-based materials.

Third Embodiment

Figure 18:
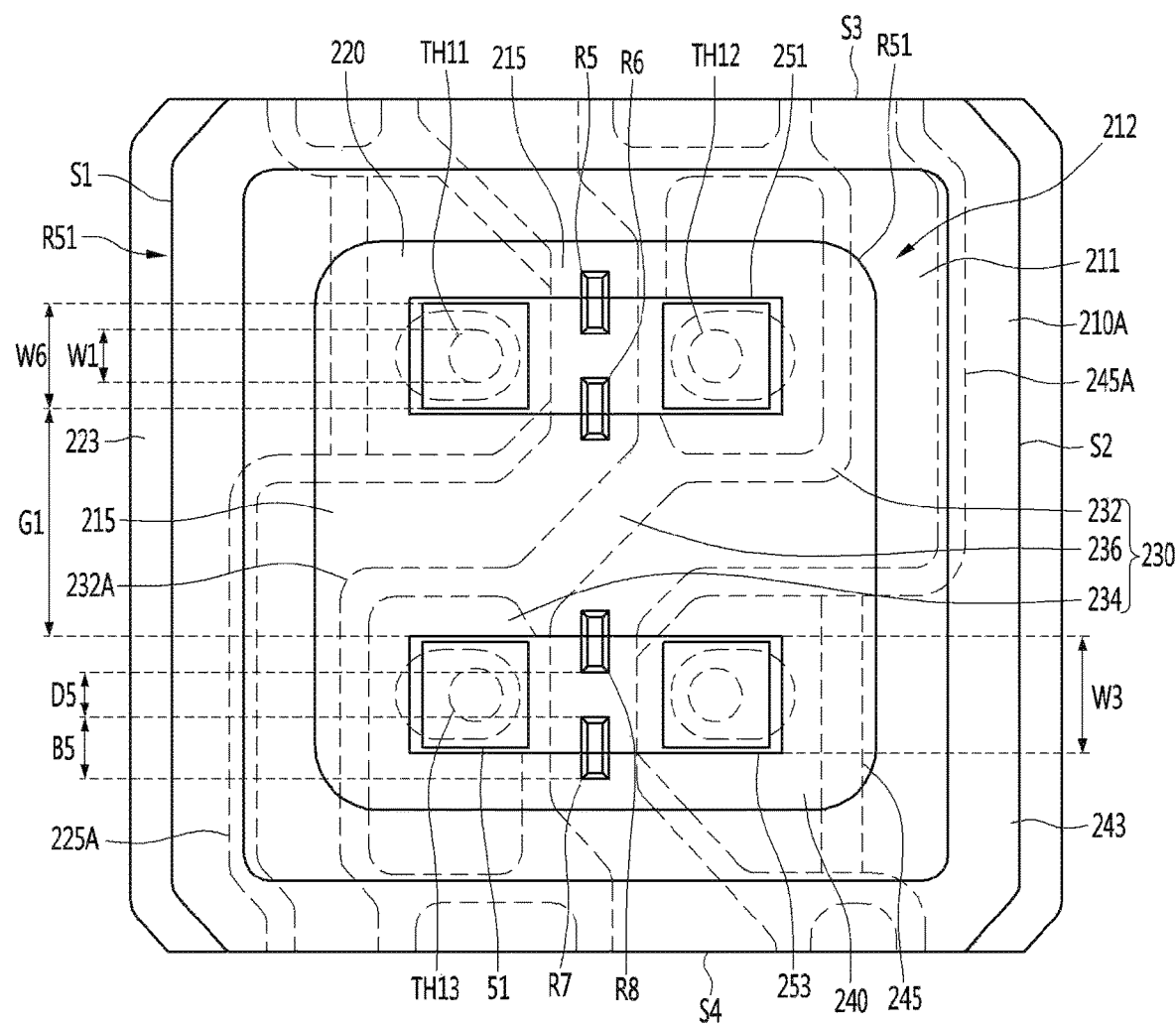
FIG. 18 is a plan view of a light emitting device package according to a third embodiment.
Figure 19A:
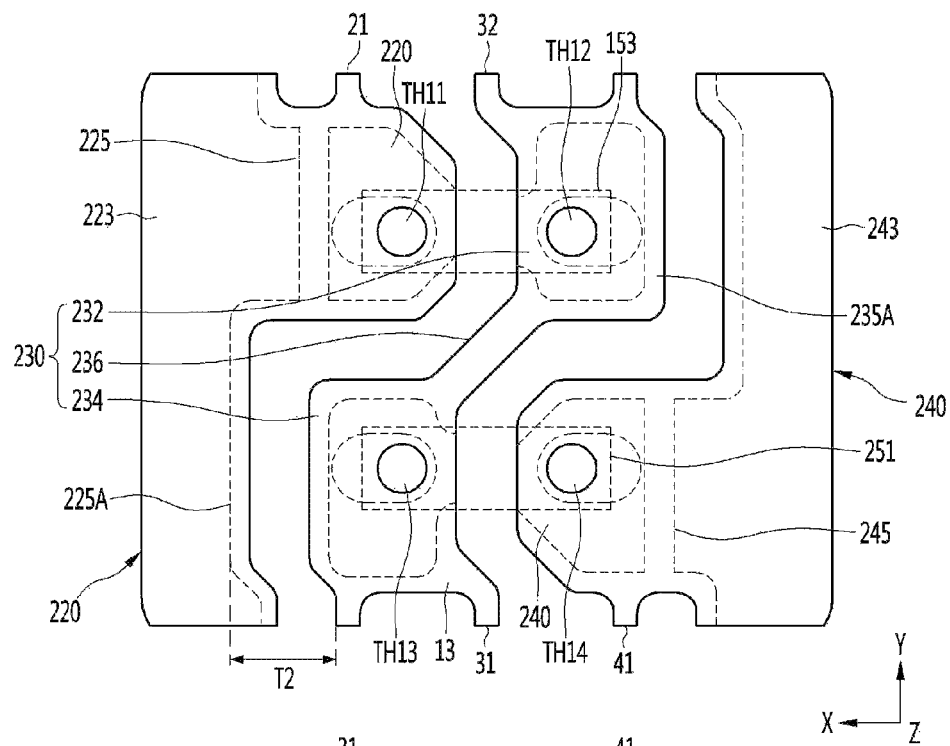
FIGS. 19A and 19B are front and rear views of a frame of the light emitting device package of FIG. 18.
Figure 19B:
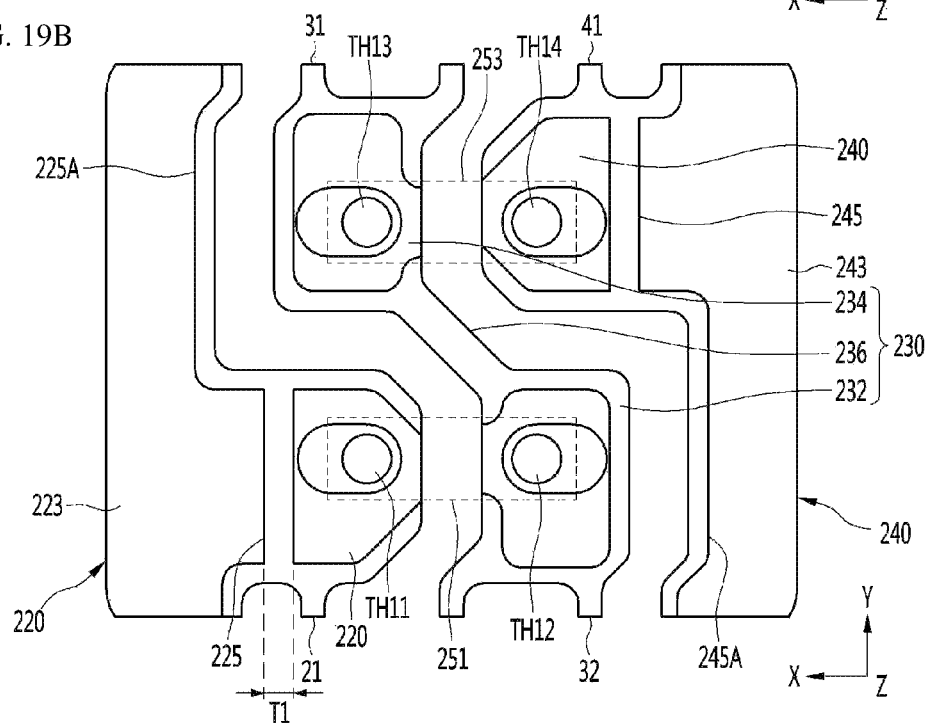
Figure 20:
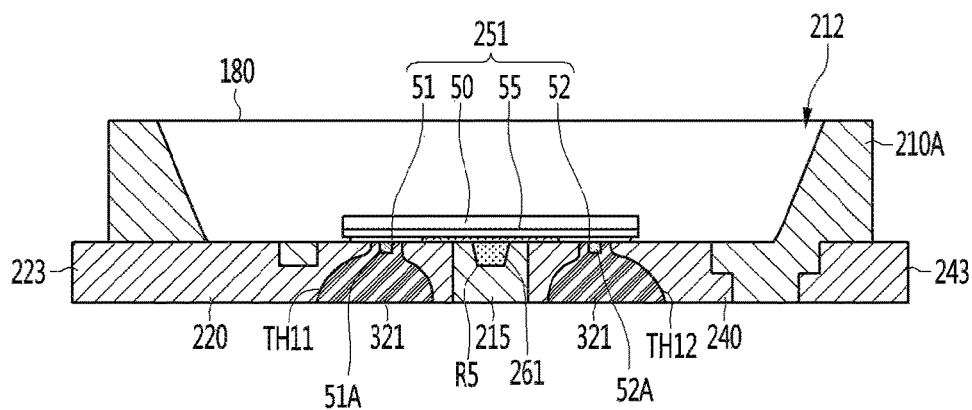
FIG. 20 is a side cross-sectional view of the light emitting device package of FIG. 18 via a connection frame portion of a second frame.

FIGS. 18 to 20 are examples of drawings of a light emitting device package according to a third embodiment. In the description of the third embodiment, the same configuration as described above refers to the description disclosed above, and will be selectively applied.

Referring to FIGS. 18 to 20, the light emitting device package 200 according to the embodiment includes a plurality of frames 220, 230, 240, a body 215, and a plurality of light emitting devices 251 and 153. The package body 210A may be disposed on the body 215 having the cavity 212. A first extension portion 223 of the first frame 220 and a second extension portion 243 of the third frame 240 may extend to the first side surface S1 and the second side surface S2. The second frame 230 may include first and second frame portions 232 and 234 and a connection frame portion 236. The configuration of the second frame 230 will be described with reference to the description of the second embodiment. A conductive portion 321 may be disposed in each of the first through hole TH11 of the first frame 220, the second through hole TH12 disposed in the first frame portion 232 of the second frame 230, the third through hole TH13 disposed in the second frame portion 234 of the second frame 230 and the fourth through hole TH14 disposed in the third frame 240. Each of the frames 220, 230 and 240 and the bonding portions 51 and 52 may be combined by an intermetallic compound layer.

As shown in (a) (b) of FIG. 19, each of the frames 220, 230, and 240 has protrusions 21, 31, 32 and 41 protruding outwardly and stepped structures 225A, 232A, and 245A, thereby enhancing a bonding force with the body 215. The minimum distance T2 between the first frame 220 and the second frame 230 may prevent electrical interference caused by diffusion of solder paste, when the light emitting device package is bonded on the circuit board. The upper recesses 225 and 245 may be exposed at the bottom of the cavity, and the width thereof may be arranged in a range of 50 µm or more, for example, 50 to 150 µm, to prevent the conductive portions such as paste from moving to a side of the cavity.

The first and second lower recesses 225 and 245 is concave on an upper portion of the first and third frames 220 and 240 and extends to the bottom of the cavity. The recesses R5, R6, R7, and R8 of the body 215 may include the first and second recesses R5 and R6 under the first light emitting device 251 and the third and fourth recesses R7 and R8 under the second light emitting device 253. The connection frame portion 236 may be disposed between the second and fourth recesses R6 and R8. The distance D5 between the first and second recesses R5 and R6 and the distance between the third and fourth recesses R7 and R8 may be smaller than the width W3 of the light emitting devices 251 and 253. The distance D5 may be equal to or smaller than the upper width W1 of the through holes TH11-TH14, and may be larger than ½ of the upper width W1. That is, the distance D5 may range from 50% to 100% of the width W1. Description of the recesses R5, R6, R7, and R8, the through holes TH11, TH12, TH13, and TH14, the conductive portion 321 and the conductive protrusion 51A and 52A may be applied the description and configuration disclosed above. In addition, a first resin 261 and a second resin may be disposed on the bottom of the cavity.

Figure 21:
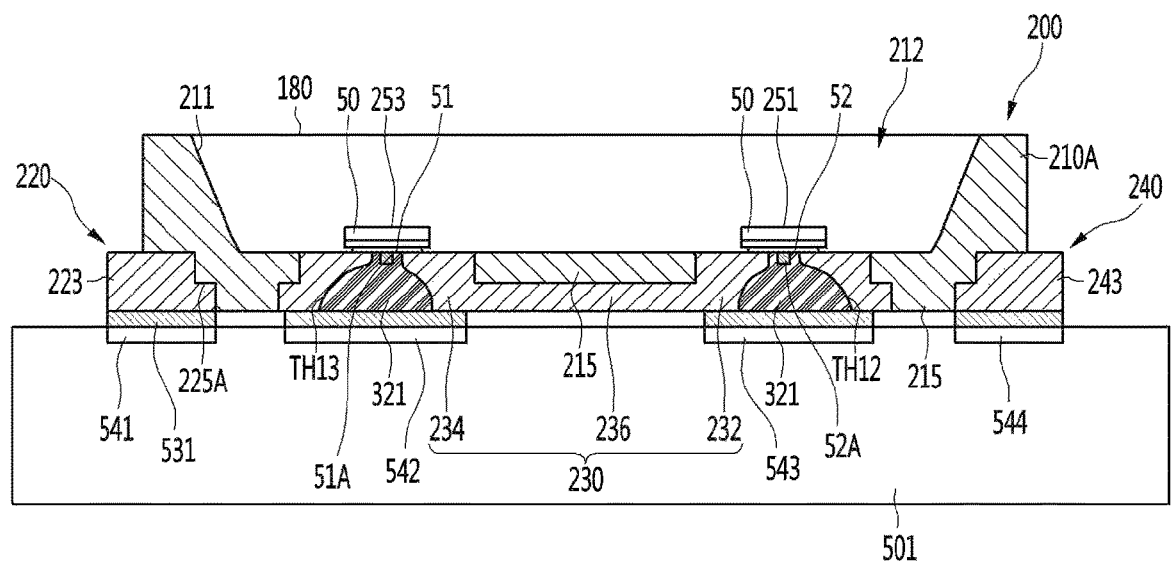
FIG. 21 is an example of a light source device having the light emitting device package of FIG. 20.
Figure 22A:
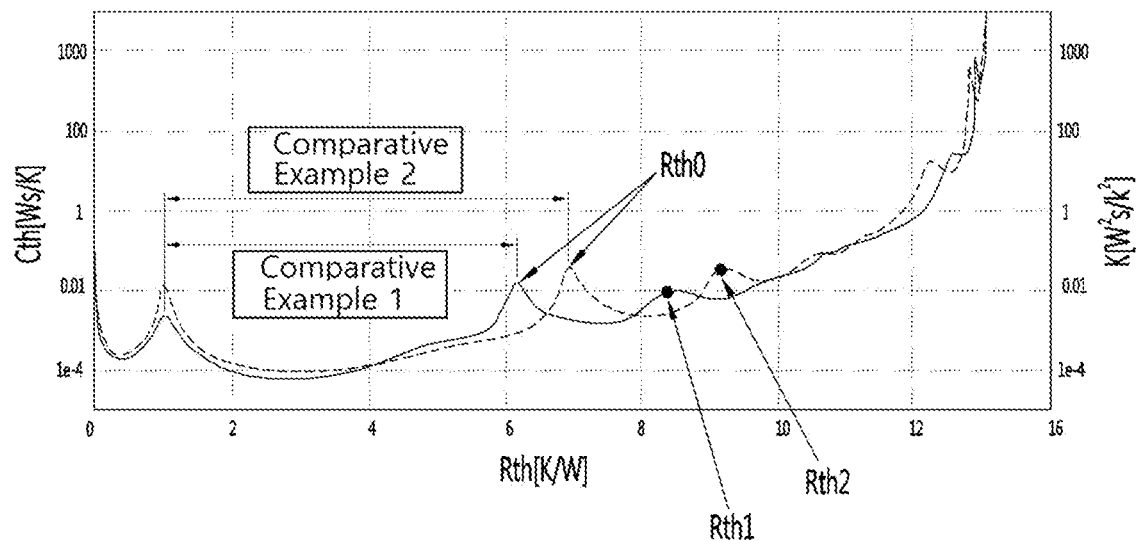
FIGS. 22A and 22B are graphs showing thermal resistance in the light emitting device packages in Comparative Examples 1 and 2 and Embodiment.
Figure 22B:
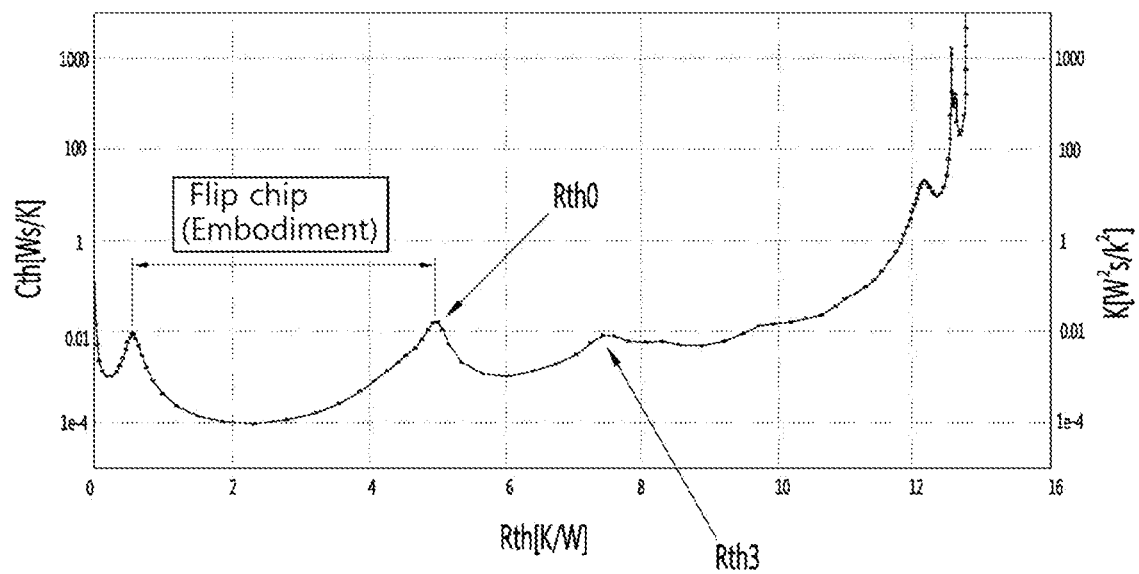

FIG. 21 is an example of a light source device or a light source module in which the light emitting device package of FIG. 20 is disposed on a circuit board. As an example, a light emitting device package of another embodiment (s) may be applied to the light source module. Referring to FIGS. 21 and 18, the light source module may include one or a plurality of light emitting device packages 200 on the circuit board 501. The pads 541, 542, 543, and 544 of the circuit board 501 may be connected to each frame 220, 230, and 240 of the light emitting device package 200 and a bonding layer 531. Each pad 541, 542, 543, and 544 of the circuit board 501 may overlap the frame 220, 230, and 240 and the through holes TH11-TH14 in a vertical direction. The bonding layer 531 may be connected to the frames 220, 230, and/or the conductive portion 321 in each through hole TH11-TH14. Here, each pad 541, 542, 543, and 544 of the circuit board 501 may have a shape corresponding to each the first frame 220, the first frame portion 232 and a second frame portion 234 of the second frame 230 and a lower surface of the third frame 240. The pads 542 and 543 of the circuit board 501 are heat dissipation pads and are not connected to a power supply terminal, and are connected to the first frame portion 232 and the second frame portion 234 of the second frame 230 and conducts heat. The heat dissipation pads 532 and 533 may lower the thermal resistance of the light emitting devices 251 and 253. If, as shown in FIG. 22(A), Comparative Example 2 is the case where the heat dissipation pad is not on the circuit board 501 disposed under the flip chip, the thermal resistance Rth2 at the thermal conduction end of the circuit board may be higher than the thermal resistance Rth0 at the thermal output end of the flip chip. In the Comparative Example 2, the heat in the flip chip is concentrated and the chip may deteriorate. Comparative Example 1 is a case in which a horizontal chip having a light-transmitting substrate is disposed in a light-emitting device package, and appears lower than the thermal resistance of Comparative Example 2. In the present invention, the thermal resistance in the flip chip may be conducted to the heat dissipation pad of the circuit board to lower the thermal resistance at the contact end with the circuit board. In addition, the invention provides a heat dissipation pad 542 and 543 of the circuit board 501 below the light emitting device of the flip chip, so that, as shown in FIG. 22B, the thermal resistance Rth3 at the thermal conduction end of the circuit board 501 may be lower than that of the thermal output end of the flip chip. In the present invention, heat dissipation pads 532 and 533 of the circuit board may be disposed in a package in which a plurality of light emitting devices are connected to provide uniform heat dissipation characteristics. In addition, through low thermal resistance, it is possible to reduce the bonding resistance, improve the operational reliability, reduce the change in luminance according to the operation, and facilitate the mounting operation.

Fourth Embodiment 4

FIGS. 23 to 27 are examples of light emitting device packages according to a fourth embodiment of the present invention. The configuration of the fourth embodiment refers to the configuration of the first to third embodiments and may be selectively applied.

Referring to FIGS. 23 to 27, the light emitting device package 400 may include a body 410, metal portions 411B and 413B, and a light emitting device 420. The body 410 may include a first body 415 and a second body 410A, the second body 410A may be disposed around the upper portion of the first body 415 and may be provided a cavity 402 having an inclined side surfaces 432. The first body 415 and the second body 410A may be combined with a coupling structure. For example, the body 410 may be formed of an insulating resin or a thermoplastic resin. Since the body 410 has a structure in which a metal frame is removed from the upper surface or the bottom of the cavity 402, the selection of the body material may be wider than the structure having the metal frame. Since the body 410 and the metal frame are not integrally injected with the lead frame, the thickness of the connection portion may be provided thinner than the thickness of the lead frame. The body 410 that is not injected with the lead frame may easily change the design of to change the position of the through hole, the shape of the cavity 402, the size of the body 410, or the package size.

The thickness of the body 410 may be an interval from the lower surface of the body to the upper surface of the second body, and may be 400 μm or more, for example, in a range of 400 to 800 μm. The thickness of the body 410 may be the sum of the thickness t3 of the first body 415 and the thickness of the second body 410A, and the thickness of the second body 410A may be more than the thickness of the light emitting device 420. Here, the thickness t2 of the first body 415 or the thickness t2 or an interval between the light emitting device 420 and the lower surface of the body may be provided 400 μm or less, for example, in the range of 80 to 400 μm or 100 to 300 μm. When the thickness t2 is thinner than the above range, the stiffness of the body may deteriorate and loss of light may occur, and when it is larger than the above range, the size of the through hole may increase and the heat dissipation efficiency may decreased. The height of the upper surface of the second body 410A may be arranged to be the same as or higher than the upper surface of the light emitting device 420 for distribution of the directivity of light. In another example, the second body 410A may be removed from the first body 415, and in this case, the package may have a light directing angle distribution of 130 degrees or more.

Figure 25:
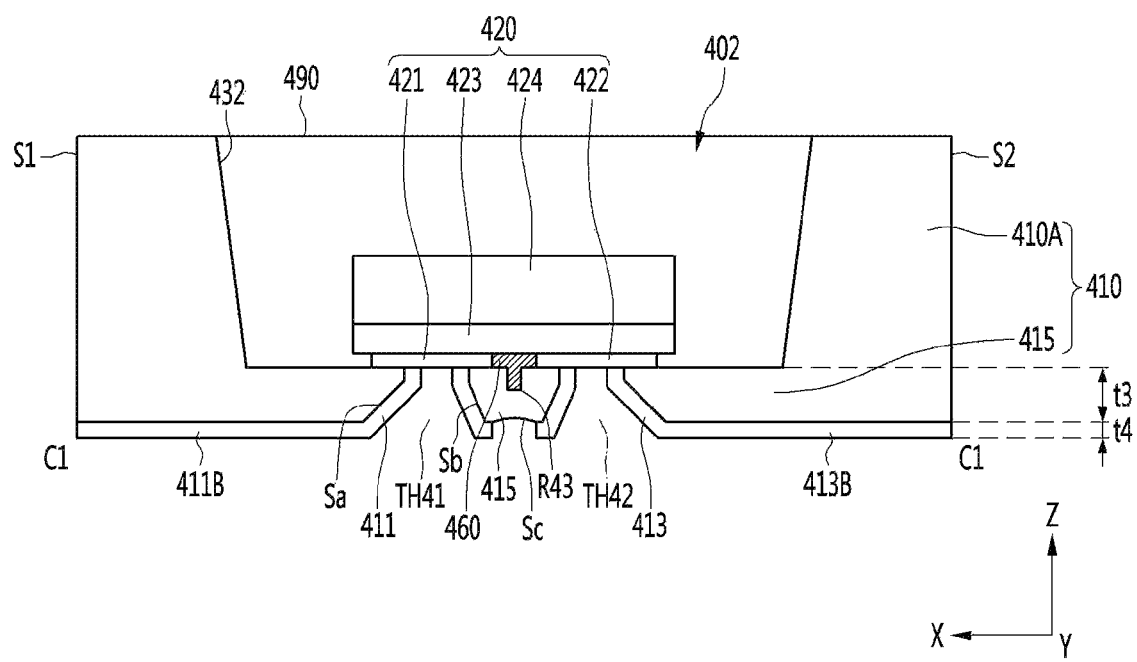
FIG. 25 is a cross-sectional view taken along the line C1-C1 side of the light emitting device package of FIG. 23.
Figure 26:
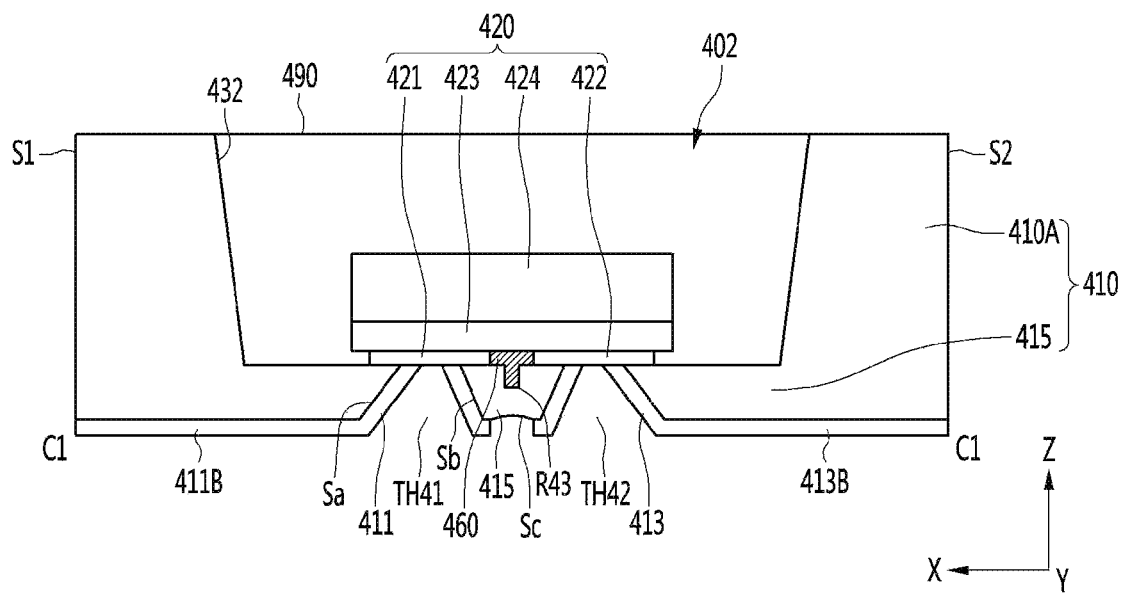
FIG. 26 is another example of a sectional view taken along the side of C1-C1 of the light emitting device package of FIG. 23.
Figure 27:
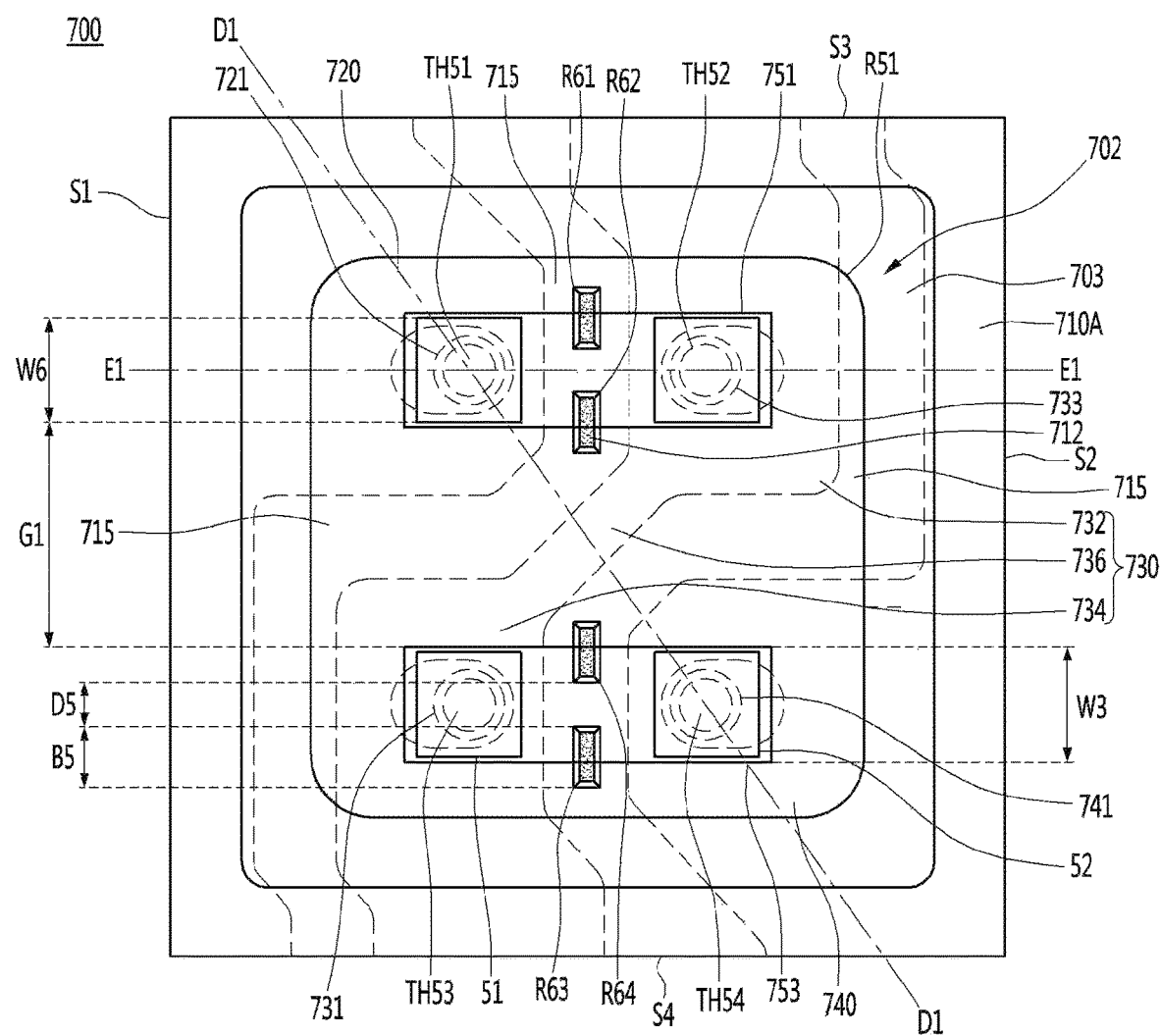
FIG. 27 is a plan view of a light emitting device package according to a fifth embodiment of the present invention.

The body 410 may include first and second through holes TH41 and TH42 spaced apart from each other, and the first and second through holes TH41 and TH42 may be penetrated from the upper surface of the first body 415 to the lower surface. The first and second through holes TH41 and TH42 may penetrate from the bottom of the cavity 402 to the lower surface of the first body 415. Here, since there is no metal frame in the body between the first and second through holes TH41 and TH42 and side surfaces S1, S2, S3, and S4, the problem due to the interface separation between the metal frame and the body material may prevented. The width or area of the upper region of the first and second through holes TH41 and TH42 may be provided to be smaller than or equal to the width or area of the lower region of the first and second through holes TH41 and TH42. The first and second through holes TH41 and TH42 may be provided in an inclined shape in which the width gradually decreases from the lower region to the upper region. The inner surfaces of the first and second through holes TH41 and TH42 may be vertical surfaces, or may include at least one or more of inclined surfaces or curved surfaces. For example, as shown in FIGS. 25 and 26, an inclined surfaces may be formed around the first and second through holes TH41 and TH42.

The distance between the first through hole TH41 and the second through hole TH42 in a region of the lower surface of the first body 415 may be 400 μm to 600 μm. The depths of the first and through holes TH41 and TH42 may be the same as the thickness t3 of the first body 415. The depths of the first and second through holes TH41 and TH42 of the body 410 may be provided in a range of 400 μm or less, for example, in the range of 80 to 400 μm or in the range of 100 to 300 μm. Here, the thickness t3 of the first body 415 may be provided in a range of 400 μm or less, such as 80 to 400 μm, or 100 to 300 μm. The depths of the first and second through holes TH41 and TH42 of the first body 415 may be equal to or thicker than the thickness of the first body 415. The thickness of the first body 415 may be greater than the thickness of the connection portions 411 and 413, that is, the horizontal thickness in the through holes TH41 and TH42. The distance between the upper surface and the lower surface of the body 410 disposed under the light emitting device 420 may be greater than the thickness of the connection portions 411 and 413, that is, the horizontal thickness in the through hole. The depths of the first and second through holes TH41 and TH42 may be greater than the thickness of the connection portions 411 and 413. As another example, the connection portions 411 and 413 may extend to the upper surfaces of the first and second through holes TH41 and TH42. For example, the first metal portion 411B may be disposed on the lower surface of the first body 415, the inner surface of the first through hole TH41 and the lower surface of the first bonding portion 421. The second metal portion 413B may be disposed on the lower surface of the first body 415, the inner surface of the second through hole TH42 and the lower surface of the second bonding portion 422. At this time, the upper surfaces of the first and second through holes TH41 and TH42 may not be opened by the connection portions 411 and 413.

The first and second through holes TH41 and TH42 may be disposed in a region overlapping the region of the light emitting device 420 in a vertical direction. The first and second through holes TH41 and TH42 may include at least one of a circular shape, an elliptical shape, a polygonal shape, and an irregular shape having straight lines and curved lines. The upper lengths of the first and second through holes TH41 and TH42 may be provided in the same length as the first direction or the second direction, or may be provided in a longer length in either direction. The lower lengths of the first and second through holes TH41 and TH42 may be provided in the same length as the first direction or the second direction, or may be provided in a longer length in either direction.

Figure 24:
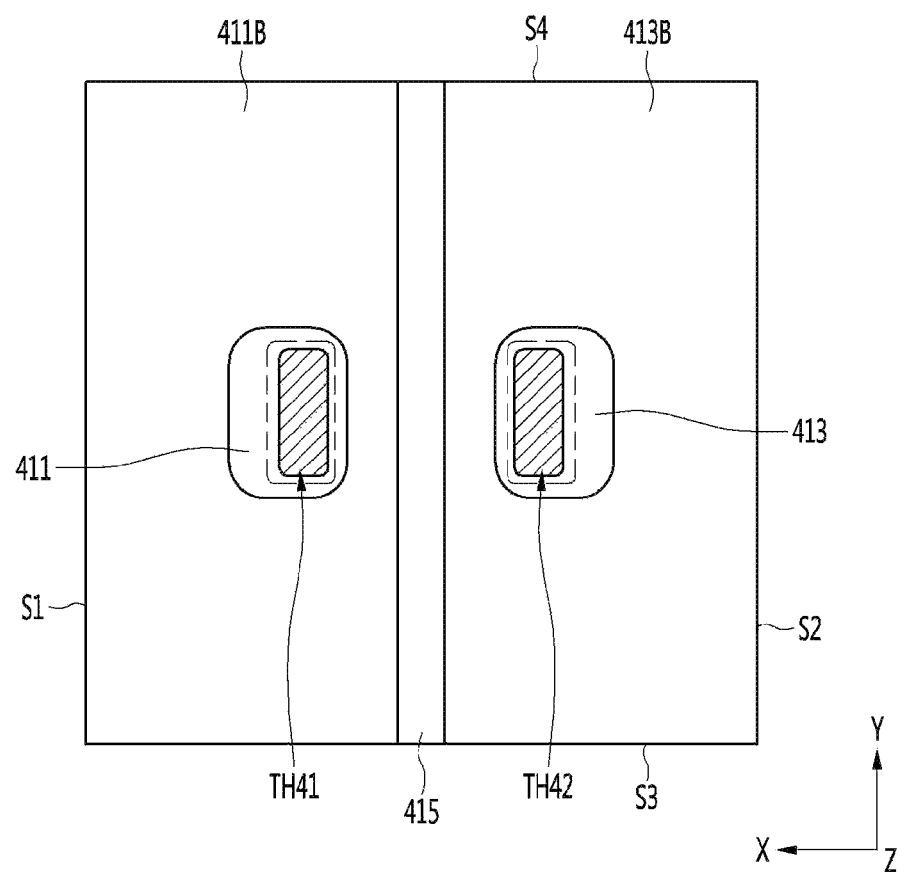
FIG. 24 is a bottom view of the light emitting device package of FIG. 23.

Each of the first and second through holes TH41 and TH42 may be disposed under one or more of the first and second bonding portions 421 and 422 of the light emitting device 420. The upper and lower shapes of the first and second through holes TH41 and TH42 may be the same or different. The upper and lower shapes of the first and second through holes TH41 and TH42 may be symmetrical or non-symmetrical. The first and second through holes TH41 and TH42 are disposed on the same vertical straight line or different vertical straight lines in the center of the upper shape and the center of the lower shape in at least one of the first direction and the second direction. For example, as illustrated in FIG. 24, upper and lower shapes of the first and second through holes TH41 and TH42 may be different from each other, or the center positions of the upper and lower portions in the first direction may be different. The first and second through holes TH41 and TH42 may have different center positions of the upper and lower portions in the second direction. The first and second through holes TH41 and TH42 may be disposed under the first and second bonding portions 421 and 422 of the light emitting device 420, and a conductive portion may be disposed in the first and second through holes TH41 and TH42.

As shown in FIG. 25, the light emitting device 420 may include first and second bonding portions 421 and 422 and a light emitting structure 423. The light emitting device 420 may include a substrate 424. The detailed configuration of the light emitting device 420 will be described with reference to the embodiments disclosed above. The light emitting device 420 may be disposed in the cavity 402. The first and second bonding portions 421 and 422 will refer to the description of the embodiment(s) disclosed above. Conductive protrusions protruding toward the lower surface of the body may be disposed under the first and second bonding portions 421 and 422, and the height or thickness of the conductive protrusions may include a description of the embodiments disclosed above. The light emitting device 420 may include one or a plurality of light emitting cells therein. A predetermined gap may be disposed in a region between the body 410 and the light emitting device 420, and a first resin 460 may be disposed in the gap. The first resin 460 attaches the light emitting device 420 to the body 410, thereby preventing flow or tilt of the light emitting device 420.

Figure 23:
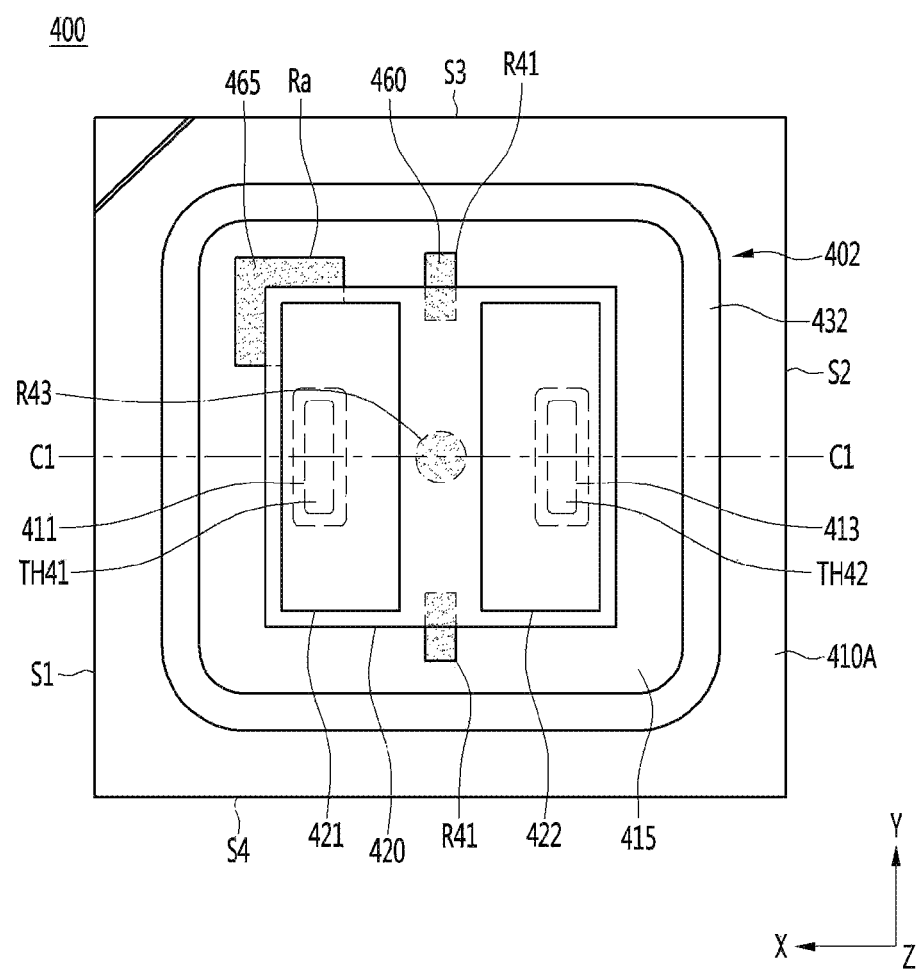
FIG. 23 is a plan view of a light emitting device package according to a fourth embodiment of the present invention.

Referring to FIGS. 23 to 24, the first and second through holes TH41 and TH42 may have a length in the Y direction equal to or greater than a width in the X direction. For example, the lower surface area of each of the first and second bonding portions 421 and 422 may be larger than the upper surface area of the first and second through holes TH41 and TH42. In the first and second through holes TH41 and TH42, a width in the same direction as the direction X overlapping the two bonding portions 421 and 422 of the light emitting device 420 may be smaller than the length in a direction Y in which the two bonding portions 421 and 422 do not overlap. Each of the first and second through holes TH41 and TH42 may have the center of the upper surface and the center of the lower surface disposed at the same center, or may be disposed to be offset from each other. In the structure as shown in FIG. 24, the centers of the upper and lower surfaces of the first and second through holes TH41 and TH42 may be different. In this case, the straight line distance between the centers of the upper surfaces of the two through holes TH41 and TH42 may be smaller than the straight line distance between the centers of the lower surfaces.

The first connection portion 411 may be disposed on the surface of the first through hole TH41 and a part of the bottom of the body 410. The second connection portion 413 may be disposed on the surface of the second through hole TH42 and a part of the bottom of the body 410. The first connection portion 411 and the second connection portion 413 may be physically separated or may be disposed so as not to overlap in the vertical direction. The first connection portion 411 may be disposed on the entire surface of the first through hole TH41, and a hole may be provided inside the first connection portion 411. The second connection portion 413 may be disposed on the entire surface of the second through hole TH42, and a hole may be provided inside of the second connection portion 413. The upper ends of the first and second connecting parts 411 and 413 may be exposed on the upper surfaces of the first and second through holes TH41 and TH42, and may be disposed on the same plane as the upper surface of the body 410.

As shown in FIG. 25, the thickness t4 of the first and second connection portions 411 and 413 may be disposed less than ½ of the smaller of the upper width of the first through hole TH41 or the width of the first and second directions, in which case holes of the first and second connection portions 411 and 413 may be provided. The sum thickness of the first connection portion 411 and the second connection portion 413 may be smaller than the upper widths of the first and second through holes TH41 in the first and second directions. The first and second connection portions 411 and 413 may have the same thickness t4, and the thickness t4 may be 5 µm or less, for example, in a range of 2 to 5 µm. When the thickness t4 is greater than the above range, improvement in thermal conductivity or improvement in electrical conduction properties is negligible. When the thickness t4 is smaller than the above range, heat dissipation efficiency or electrical conduction properties may deteriorate. The first and second connection portions 411 and 413 may be formed on the lower surface of the body through a deposition process or a plating process. The thickness t4 of the first and second connection portions 411 and 413 may be smaller than the thickness t3 between the upper and lower surfaces of the body 410. The thickness of the first and second metal portions 411B and 413B may be the thickness t4. The thickness t4 may be 1/30 or less of the thickness t3, for example, in a range of 1/30 to 1/400. The ratio of the thicknesses t4 and t3 may range from 1:30 to 1:400. This is formed by forming the connection portions 411 and 413 on the surface of the body 410 through a deposition process or a plating process, and may be provided with a thin thickness.

The first connection portion 411 and the second connection portion 413 may be made of metal. The first and second connection portions 411 and 413, for example, may be selected from copper (Cu), titanium (Ti), nickel (Ni), gold (Au), chromium (Cr), tantalum (Ta), platinum (Pt), and tin (Sn), and silver (Ag), and may be formed in a single layer or multiple layers. The first connection portion 411 and the second connection portion 413 are multi-layered, and may include a first layer contacting the body 410 and a second layer under the first layer, and the first layer includes at least one of Ti, Cr, Ta, and Pt, and the second layer may include at least one of Au, Ag, and Cu.

Since the present invention does not integrally eject the frame and the body, it is possible to solve the problem due to the difference in the coefficient of thermal expansion between the two materials when the frame and the body disposed under the light emitting device are combined. In addition, by performing a deposition process or a plating process using metal on the surfaces of the through holes TH41 and TH42 provided in advance in the body 410, the thickness of the connection portions 411 and 413 may be provided with a thin thickness. As another example, each of the first and second connection portions 411 and 413 may be disposed on a portion of the surface of the first and second through holes TH41 and TH42. The first connection portion 411 is disposed in a region adjacent to the first side surface S1 among the surfaces of the first through hole TH41, and the body surface of the other region may be exposed. The second connection portion 413 may be disposed in a region closer to the second side surface S2 among the surfaces of the second through hole TH42, and the body surface may be exposed to the other surface.

As shown in FIGS. 24 and 25, the lower surface area of the first metal portion 411B disposed on the lower surface of the body 410 is ½ or less of the lower surface area of the body 410, for example, in a range of ½ to ⅕. The lower surface area of the second metal portion 413B may be ½ or less, for example, in a range of ½ to ⅕ of the lower surface area of the body 410. The first metal portion 411B may be partially or entirely disposed on the lower surface of the body between the first through hole TH41 and the first side S1 of the body 410 based on the first through hole TH41. As another example, a portion of the first metal portion 411B may extend on the first side surface S1 of the body 410. A portion of the second metal portion 413B may extend to the second side S2 of the body 410. The first metal portion 411B may be exposed on a lower portion of at least one of the first side surface S1, the third and fourth side surfaces S3 and S4 of the body 410. The second metal portion 413B may be exposed on at least one of the second side surface S1, and the third and fourth side surface S3 and S4 of the body 410. The first metal portion 411B and the second metal portion 413B may be disposed on a vertical plane such as at least one side or two or more side surfaces of the body 410. The first and second metal portions 411B and 413B may extend on at least one side or two or more side surfaces of the body 410.

The inner portion of the first metal portion 411B may extend toward the second through hole TH42 or the second side surface S2 based on the first through hole TH41. The inner portion of the second metal portion 413B may extend toward the first through hole TH41 or the first side surface S1 based on the second through hole TH42. Between the first and second metal portions 411B and 413B, the lower surface of the body 410 may be exposed, or a concave recess Sc may be provided. The concave portion Sc is concave toward the upper surface from the lower surface of the body 410, and may be a curved surface or an angled surface, or may have a rough surface. The concave portion Sc is a region in which the first and second metal portions 411B and 413B are removed, and the first and second connection portions 411 and 413 may be electrically separated. The length of the second direction Y of the concave portion Sc may be have the same as the length of the first and second metal portions 411B and 413B, or the length of the second direction of the lower surface of the body 410. The concave portion Sc may be have a region removed through a laser scribing process after forming a connection portion at a lower portion of the body. The depth of the concave portion Sc may be 1 µm or less from the lower surface of the body, for example, in a range of 0.01 to 1 µm, or less than the thickness of the connection portions 411 and 413 from the lower surface of the body. When the depth of the concave portion Sc is larger than the above range, the stiffness between the first and second through holes TH41 and TH42 may be deteriorated.

The surface area of the first and second connection portions 411 and 413 disposed in the first and second through holes TH41 and TH42 may be smaller than the surface area of the first and second through holes TH41 and TH42. Each area of the first and second connection portions 411 and 413 disposed in the first and second through holes TH41 and TH42 may be smaller than each area of the first and second metal portions 411B and 413B. The heights of the first and second connection portions 411 and 413 disposed in the first and second through holes TH41 and TH42 may be greater than the heights of the first and second through holes TH41 and TH42, and the first body and may be greater than the thickness of the first body 415. Since the heights of the first and second connection portions 411 and 413 include the thicknesses of the first and second metal portions, the heights of the first and second connection portions 411 and 413 may protrude further below the lower surfaces of the first and second through holes TH41 and TH42. As another example, the upper portions of the first and second connection portions 411 and 413 may extend to the upper surface of the first body 415 through the first and second through holes TH41 and TH42. In this case, a part of the connection portion extending to the upper surface of the body 410 may face the first and second bonding portions 421 and 422 of the light emitting device 420 under the region of the light emitting device 420.

Figure 31:
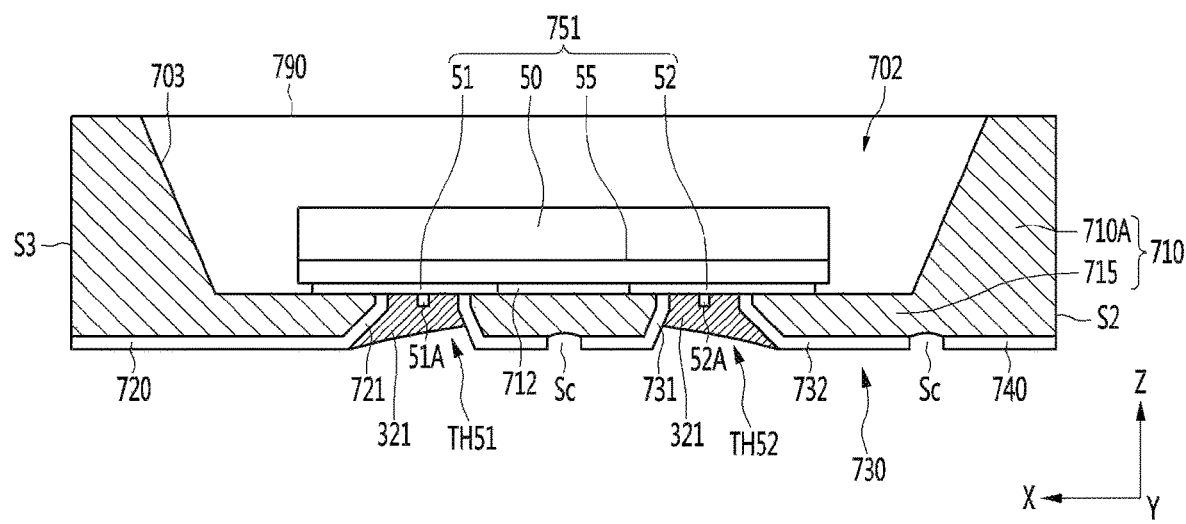
FIG. 31 is an example in which a conductive portion is disposed in a through hole of the light emitting device package of FIG. 30.

The first and second connection portions 411 and 413 may be connected to the first and second bonding portions 421 and 422. The first connection portion 411 may be in contact with or connected to the first bonding portion 421. The second connection portion 413 may be in contact with or connected to the second bonding portion 422. A metal or intermetallic compound (IMC) layer may be disposed at the interfaces between the first and second connection portions 411 and 413 and the first and second bonding portions 421 and 422, and refer to the description disclosed above. As shown in FIG. 31, conductive portions 321 may be included in the first and second through holes TH41 and TH42. The conductive portion disposed inside the through holes TH41 and TH42 may be disposed with an insulating material thereunder, and in this case, the conductive portion may be prevented from leaking to the lower portion. The conductive portion may be connected to the first connection portion 411 disposed in the first through hole TH41, and may be connected to the second connection portion 413 disposed in the second through hole TH42. Accordingly, electrical and thermal paths by the conductive portion can be minimized.

An embodiment of the invention may prevent the flow or diffusion of the conductive portion under the body, and may improve the bondability of the connection portions 411 and 413 and the conductive portion in each of the through holes TH41 and TH42. Since diffusion of the conductive portion may be suppressed, since the conductive portion has a constant distribution or shape, it is possible to prevent an electric open problem or a decrease in heat transfer efficiency due to an uneven distribution of the conductive portion. Since resin is exposed on some surfaces of each of the through holes TH41 and TH42 and the connection portions 411 and 413 are disposed on the other surface, the formation of voids in the through holes TH41 and TH42 where the conductive portions are disposed is suppressed or the size of voids that are generated may reduce.

Each of the recesses R41, R42, and R43 may overlap the light emitting device 420 with at least a portion or all of the upper surfaces of the body 410 in the vertical direction. As shown in FIGS. 23 and 25, the first recess R41 extends in the direction of the third side surface S3 in the region between the first and second through holes TH41 and TH42, and the second recess R42 may extend in a direction of the fourth side surface S4 in the region between the first and second through holes TH41 and TH42. The recess of the body 410 may include a third recess R43 recessed in the region between the first and second through holes TH41 and TH42. The third recess R43 may be concavely disposed in the region between the first and second connection portions 411 and 413. A portion of the first resin 460 may be disposed in the recesses R41, R42, and R43. The first resin 460 disposed in the recesses R41, R42, and R43 is bonded to the lower surface of the light emitting device 420, thereby preventing the light emitting device 420 from being tilted or flowing. The first resin 460 may contact the conductive portions disposed in the through holes TH41 and TH42 through between the first and second bonding portions 421 and 422 and the first and second connection portions 411 and 413. The depths of the recesses R41, R42, and R43 may be formed to a predetermined depth from the upper surface of the body 410, for example, may be 20 µm or more or in a range of 20 to 60 µm. When the depths of the recesses R41, R42, and R43 are greater than the above range, the stiffness of the first body 415 may be reduced, and when it is less than the above range, the supporting force may be insignificant. The depth of the recesses R41, R42, and R43 may be smaller than the thickness of the first body 415.

As shown in FIG. 23, the body 410 may have a concave outer recess Ra on an upper surface on which the light emitting device 410 is disposed. For the convenience of description, the outer recess Ra will be described as a fourth recess. The fourth recess Ra may be disposed at least one of the corners of the light emitting device 420. As another example, the fourth recess Ra may be disposed at one, two or more corners of the light emitting device 420. That is, when a plurality of fourth recesses Ra are disposed, they may be spaced apart from each other. The inner portion of the fourth recess Ra may overlap the lower surface of the light emitting device 420 in the vertical direction, and the outer portion may be exposed outside the lower surface of the light emitting device 420. The inner portion of the fourth recess Ra is disposed with a minimum distance of 0.1 µm or more from the side surface of the light emitting device 420, thereby preventing the adhesion of the light emitting device 420 from lowering. The outer portion of the fourth recess Ra may be the same as or smaller than the area of the inner portion. The top view shape of the fourth recess Ra may be a polygonal shape, or may include an ellipse or a circle shape. A second resin 465 may be disposed in the fourth recess Ra. The second resin 465 may be adhered to a bottom side and/or side of the corner of the light emitting device 420. The second resin 465 may be in contact with a bonding portion adjacent to a corner of the light emitting device 420 to prevent tilt or flow of the light emitting device 420. The second resin 465 may be in contact with or connected to the first resin 460. The second resin 465 may include a resin material such as silicone or epoxy, or a metal oxide or filler therein. The fourth recess Ra may be spaced at least 80 µm or more from the first through hole TH41, for example, may be spaced in the range of 80 to 420 µm. When the distance between the fourth recess Ra and the first through hole TH41 is closer than the range, stiffness in the region between the fourth recess Ra and the first through hole TH41 may be degrade. The fourth recess Ra may function as an identification mark or alignment mark for identifying or aligning the direction of the electrode at any one corner of the light emitting device 420.

Here, the body 410 and the first resin 460 and the second resin 465 may be formed of the same resin material, in this case, the first and second resins 460 and 465 and the body 410 The adhesive force between can be improved. In addition, since the body 410 is provided with a structure having a cavity therein, moisture advancing into the cavity in the lateral direction of the body 410 may be blocked. Here, the minimum distance between the side surface 432 of the cavity 402 of the body 410 and the light emitting device 420 may be 50 µm or more, for example, in a range of 50 to 200 µm. Accordingly, the distance between the inner side 432 of the body 410 and the light emitting device 420 is reduced, thereby reducing light loss.

As shown in FIGS. 25 and 26, the center of the lower surface of the first through hole TH41 is disposed adjacent to the direction of the first side surface S1 compared to the center of the upper surface, and the center of the lower surface of the second through hole TH42 is disposed adjacent to the direction of the second side surface S2 compared to the center of the upper surface. Accordingly, the inclination angles of the two inner side surfaces Sa and Sb facing each other in the first and second through holes TH41 and TH42 may be provided differently, for example, an inclination angle of the outer first inner surface Sa with respect to the lower surface of the body may be greater than the inclined angle of the inner second inner surface Sb. The inclination angles of the first and second inner surfaces Sa and Sb may be an angle of a straight line connecting the top and bottom of each through hole. As shown in FIG. 25, in the first and second through holes TH41 and TH42, when the upper portion of the second inner surface Sb is a vertical surface and the lower portion is an inclined surface, the height of the lower portion having the inclined surface in the through holes TH41 and TH42 may be greater than the height of the upper portion with a vertical surface. As shown in FIG. 26, the upper ends of the first inner surfaces Sa and the upper ends of the second inner surfaces Sb in the first and second through holes TH41 and TH42 may be curved or angled surfaces. When the upper end of the first inner surface Sa and the upper end of the second inner surface Sb in the first and second through holes TH41 and TH42 are curved surfaces, bonding efficiency with the connection portions 411 and 413 may be improved and a breakage of the end portion may be improved. In the first and second through holes TH41 and TH42, since the first inner surface Sa has a larger area than the second inner surface Sb and is provided as an inclined surface, injection of the conductive portion provided in the liquid phase may be easy, the contact area with the conductive portion may be increased, and the generation of voids in the inner region can be suppressed. The light emitting device package may include the conductive protrusion disclosed in the embodiment below the light emitting device 420. The conductive protrusion may be connected to the conductive portion in the first and second through holes TH41 and TH42.

To explain at the process of forming the package having the light emitting device, a plurality of through holes are provided in the body, and a metal layer divided into a connection portion and a metal portion may be formed on the lower surface of the body and the inner surface of the through hole. The metal layer divided into the connection portion and the metal portion may be deposited using deposition equipment. When the metal layers are formed to be connected to each other, the first connection portion 411 and the first metal portion 4111B, and the second connection portion 413 and the second metal portion 413B may be separated using a laser scribing equipment. Here, the concave portion Sc may be disposed lower than the body surface in the portion irradiated with the laser. Thereafter, the light emitting device is attached using the first resin to be placed on the first and second through holes and molded into the molding part 490. Here, after the molding part is formed or before it is formed, a side surface of the body 410 is cut into a package unit 1, and may be provided as a separate package. Here, when provided in a package having a plurality of light emitting devices, the package may be cut in units of packages having two or more light emitting devices. For example, the package may be cut into a package having two or more light emitting devices in the first direction and/or the second direction.

Fifth Embodiment 5

FIGS. 27 to 33 are examples of drawings of a light emitting device package according to a fifth embodiment of the present invention. The configuration of the fifth embodiment may be selectively applied to the configuration of the fourth embodiment, and a description of parts overlapping with the structure of FIG. 18 will be omitted.

Referring to FIGS. 27 to 33, the light emitting device package 700 may include a body 710, a plurality of metal portions 720, 730 and 740, and a plurality of light emitting devices 751 and 753. The body 710 may include a first body 715 having a plurality of through holes, and a second body 710A having a cavity 702 on the first body 715. The first and second through holes TH51 and TH52 of the body 710 are disposed under the first light emitting device 751, and the third and fourth through holes TH53 and TH54 are disposed under the second light emitting device 753. The through holes TH51, TH52, TH53, and TH54 will be described with reference to the fourth embodiment.

Figure 28:
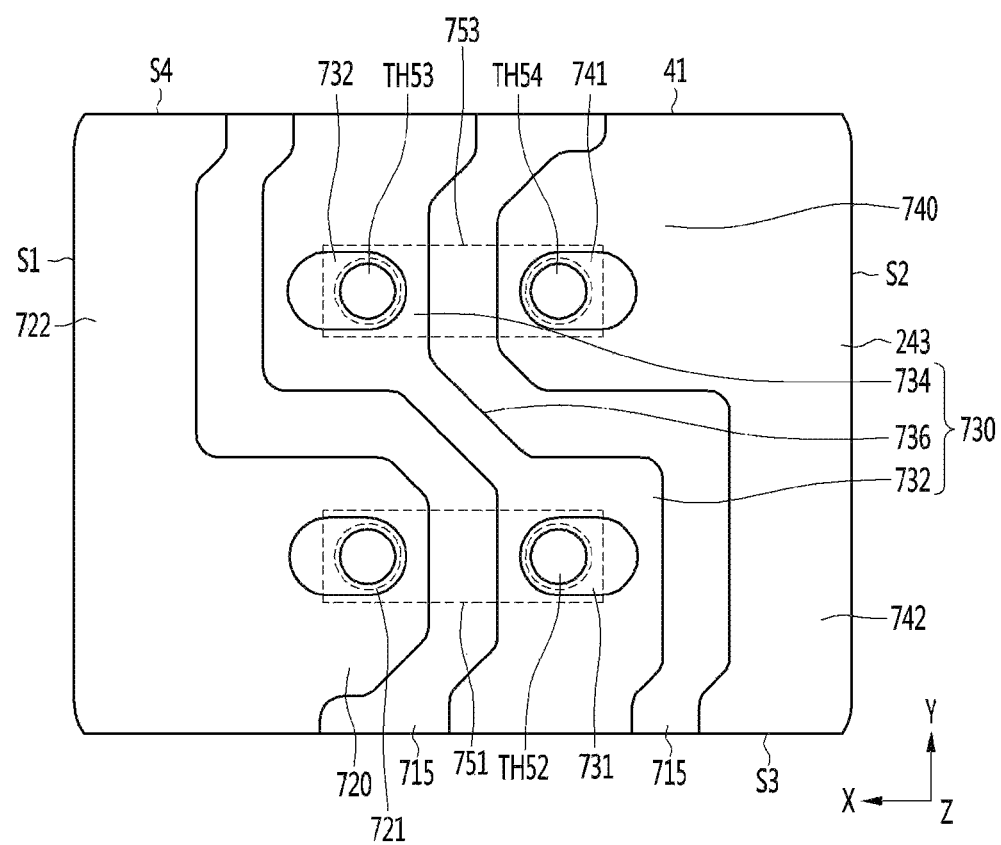
FIG. 28 is a bottom view of the light emitting device package of FIG. 27.
Figure 29:
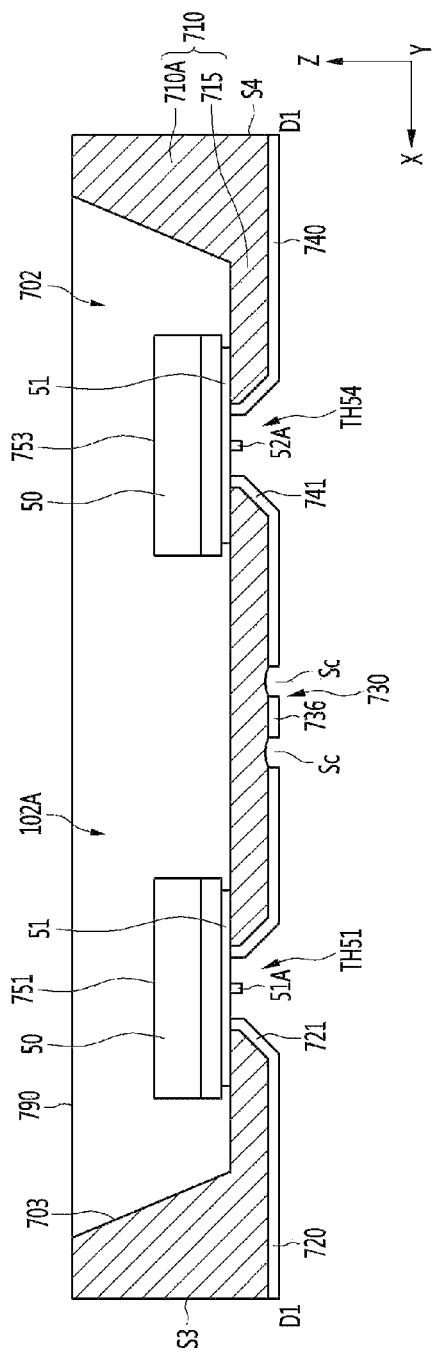
FIG. 29 is a cross-sectional view taken along D1-D1 side of the light emitting device package of FIG. 27.
Figure 30:
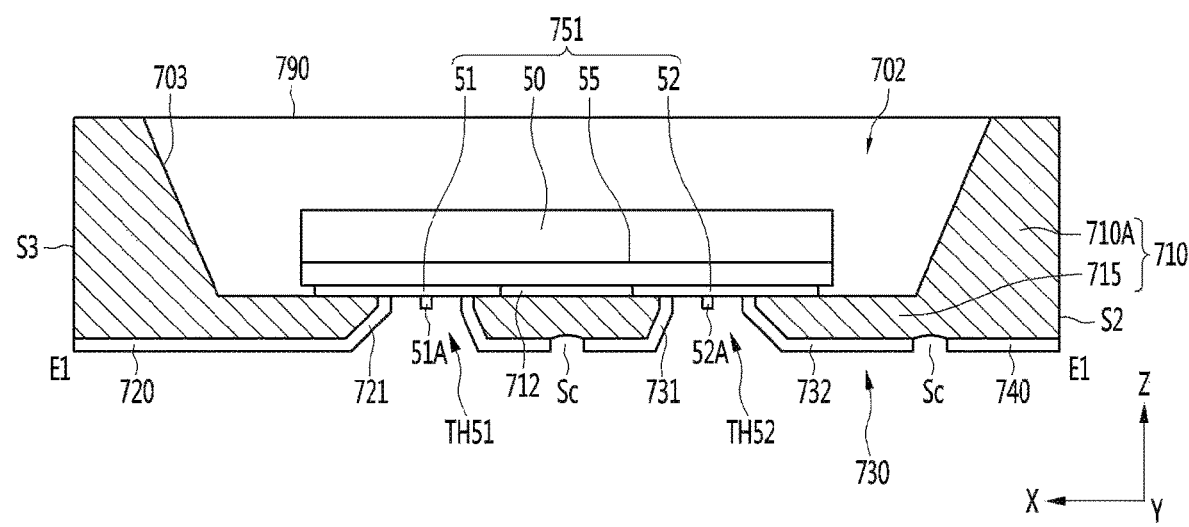
FIG. 30 is a cross-sectional view taken along E1-E1 side of the light emitting device package of FIG. 27.

As shown in FIGS. 28 to 30, the plurality of metal portions are disposed separately from the lower surface of the body 710, and may include first to third metal portions 720, 730, and 740. The second metal portion 730 may be disposed between the first and third metal portions 720 and 740 and connect adjacent first and second light emitting devices 751 and 753 in series. In this case, when a plurality of the second metal portions 730 are disposed, three or more light emitting devices may be connected in series. As another example, when the second metal portion 730 is not provided, a plurality of light emitting devices may be connected in parallel. The second metal portion 730 may include a first extension part 732 disposed under the first light emitting device 751, a second extension part 734 disposed under the second light emitting device 753, and an intermediate connection portion 736 connecting the first and second extension parts 732 and 734, on the lower surface of the body 710.

The first metal portion 720 may include a first connection portion 721 disposed on the surface of the first through hole TH51. The second metal portion 730 may include second and third connection portions 731 and 733 disposed on the surfaces of the second and third through holes TH52 and TH53. The second and third connection portions 731 and 733 may be connected to the intermediate connection portion 736 through the first and second extension parts 732 and 734. The third metal portion 740 may include a fourth connection portion 741 disposed on the surface of the fourth through hole TH54. The second metal portion 740 and the fourth connection portion 741 may be connected to each other. The first bonding portion 51 of the first light emitting device 751 is connected to the first connection portion 721 of the first metal portion 720 on the first through hole TH51, and the second bonding portion 52 may be connected to the second connection portion 731 of the second metal portion 730 on the second through hole TH52. The first bonding portion 51 of the second light emitting device 753 is connected to the third connection portion 723 of the second metal portion 723 on the third through hole TH53, and the second bonding portion 53 may be connected to the fourth connection portion 741 of the third metal portion 740 on the fourth through hole TH54.

The first resin 712 may be disposed on the light emitting devices 751 and 753, the upper surface of the first body 715, and the plurality of recesses R61, R62, R63, and R64, and refer to the description of the embodiments disclosed above. An outer recess and a second resin as in the fourth embodiment in the outer corner of the light emitting devices 751 and 753 are disposed to prevent tilt or moving of each light emitting device 751 and 753. A molding part 790 may be disposed on the cavity 702 or the light emitting devices 751 and 753. The concave portion Sc is disposed on the lower surface of the region between the first and second and third metal portions 720, 730, and 740 to separate the metal portions from each other.

Figure 32:
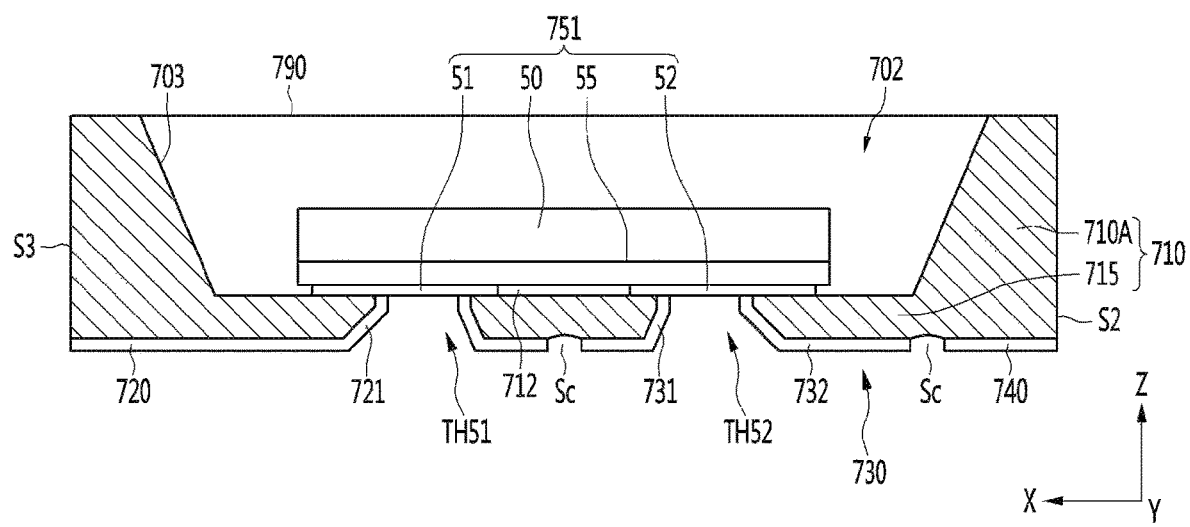
FIG. 32 is another example of a light emitting device in the light emitting device package of FIG. 30.
Figure 33:
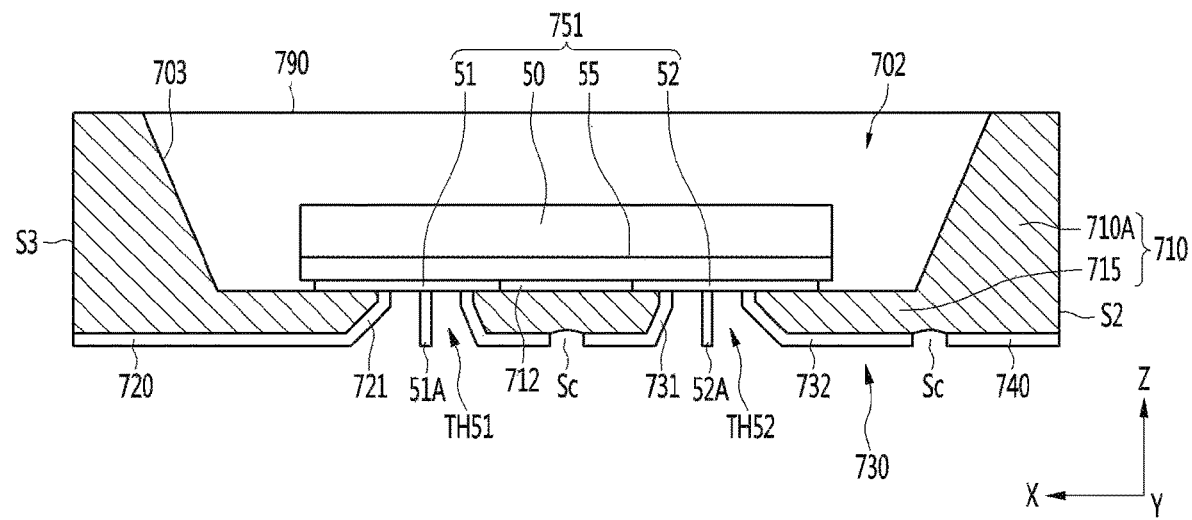
FIG. 33 is another example of a light emitting device in the light emitting device package of FIG. 30.

As shown in FIGS. 30 and 31, the conductive protrusions 51A and 52A are disposed in each bonding portion 51 and 52 of each light emitting device 751 and 753, or the bonding portions 51 and 52 of each light emitting device 751 and 753 without conductive protrusions as shown in FIG. 32. As shown in FIG. 33, the conductive protrusions 51A and 52A on each of the bonding portions 51 and 52 of the light emitting devices 751 and 753 may extend to the lower surface of the body or to the lower surface of the metal portion through each through hole. The conductive portion disposed in the through hole may connect the conductive protrusions 51A and 52A, the bonding portions 51 and 52 and the connection portions to each other.

The configuration of the fourth and fifth embodiments may be selectively combined with each other or selectively applied to other first to third embodiments. Alternatively, features such as the arrangement form of the light emitting device disclosed in the first to third embodiments, the structure or shape of the recess, and the configuration such as the position of the first resin may be selectively applied to the fourth and fifth embodiments. In the light emitting device package according to the first to fifth embodiments, each through hole may be provided without a conductive portion.

The light emitting device package according to the embodiment may be applied to a light source device. The light source device may include a display device, an indication device, a lighting device, various vehicle lamps, and the like according to the industrial field. The light source device may be disposed in various display devices or in various light units.

The invention claimed is:

1. A light emitting device package comprising:
a first frame having a first through hole;
a second frame having a second through hole and spaced apart from the first frame in a first direction;
a body disposed between the first and second frames; and
a light emitting device disposed on the first and second frames,
wherein an area of a lower surface of each of the first and second through holes is greater than an area of an upper surface of each of the first and second through holes,
wherein a center of the upper surface and a center of the lower surface of the first through hole are offset from each other in a vertical direction,
wherein a center of the upper surface and a center of the lower surface of the second through hole are offset from each other in the vertical direction,
wherein each of the first frame and the second frame is formed of a metal material,
wherein a thickness of each of the first and second frames is a distance between the upper and lower surfaces of each of the first and second frames,
wherein the first through hole is penetrated from the upper surface of the first frame to the lower surface of the first frame, and
wherein the second through hole is penetrated from the upper surface of the second frame to the lower surface of the second frame.

2. The light emitting device package of claim 1, wherein a width of the lower surface of the first through hole is wider than a width of the upper surface of the first through hole in the first direction, and a width of the lower surface of the second through hole is wider than a width of the upper surface of the second through hole in the first direction.

3. The light emitting device package of claim 2, wherein a width of the lower surface of the first through hole is wider than a width of the upper surface of the first through hole in a second direction, and a width of the lower surface of the second through hole is wider than a width of the upper surface of the second through hole in the second direction, and
wherein the first and second directions are orthogonal to each other.

4. The light emitting device package of claim 1, wherein the light emitting device has a length in the first direction longer than a length in a second direction,
wherein the light emitting device includes a first bonding portion facing the upper surface of the first through hole and a second bonding portion facing the upper surface of the second through hole, and
wherein the first and second directions are orthogonal to each other.

5. The light emitting device package of claim 1, wherein the center of the lower surface of each of the first and second through holes is further spaced apart from the body than the center of the upper surface of each of the first and second through holes.

6. The light emitting device package of claim 1, wherein the center of the lower surface of the first through hole is spaced apart in a direction away from the second frame with respect to the center of the upper surface of the first through hole, and the center of the lower surface of the second through hole is spaced apart in a direction away from the first frame with respect to the center of the upper surface of the second through hole.

7. The light emitting device package of claim 1, further comprising:
at least one recess on the upper surface of the body;
a first resin disposed in the recess; and
a second resin around a lower portion of the light emitting device,
wherein the recess overlaps the light emitting device in the vertical direction.

8. The light emitting device package of claim 1, wherein a conductive portion is disposed in the first and second through holes.

9. The light emitting device package of claim 8, wherein the light emitting device includes conductive protrusions disposed in the first and second through holes, and the conductive protrusions contact the conductive portion.

10. The light emitting device package of claim 1, wherein the light emitting device includes a first bonding portion facing the upper surface of the first through hole and a second bonding portion facing the upper surface of the second through hole, and the light emitting device is provided with conductive protrusions disposed on each of the first and second bonding portions, extending in the first and second through holes and being exposed through the first and second through holes.

11. A light emitting device package comprising:
a plurality of frames;
a plurality of through holes disposed in each of the plurality of frames;
a body disposed between the plurality of frames;
a light emitting device disposed on the plurality of frames and the body; and
a resin disposed on each of upper surfaces of the plurality of frames, and an upper surface of the body,
wherein a lower portion of the light emitting device includes a plurality of conductive protrusions inserted into each of the plurality of through holes,
wherein the plurality of conductive protrusions protrude toward lower surfaces of the plurality of frames,
wherein the plurality of conductive protrusions have a pillar shape made of metal,
wherein a center of the upper surface and a center of the lower surface of each of the plurality of through holes is offset from each other in a vertical direction,
wherein a thickness of each of the plurality of frames is a distance between the upper surface to lower surface of each of the plurality of frames, and
wherein each of the plurality of through holes is respectively penetrated from the upper surface to the lower surface of the plurality of frames.

12. The light emitting device package of claim 11, wherein each of the plurality of frames is formed of a metal material, and wherein the plurality of conductive protrusions have a height greater than the thickness of each of the plurality of frames.

13. The light emitting device package of claim 11, wherein the plurality of frames includes a first frame and a second frame overlapping the light emitting device in the vertical direction,
- wherein the plurality of through holes include a first through hole disposed in the first frame and a second through hole disposed in the second frame,
- wherein the plurality of conductive protrusions include a first conductive protrusion disposed in the first through hole and a second conductive protrusion disposed in the second through hole, and
- wherein a minimum interval between the first and second conductive protrusions is greater than a minimum interval between the first and second through holes.

14. The light emitting device package of claim 11, wherein a width of the lower surface of each of the plurality of through holes in a first direction is wider than a width of the upper surface of each of the plurality of through holes in the first direction,
- wherein the light emitting device has a length in the first direction longer than a length in the second direction, and
- wherein the first and second directions are orthogonal to each other.

15. The light emitting device package of claim 11, wherein a width of each of the plurality of through holes in a second direction is wider than a width of the upper surface of each of the plurality of through holes,
- wherein the light emitting device has a length in a first direction longer than a length in a second direction, and
- wherein the first and second directions are orthogonal to each other.

16. The light emitting device package of claim 11, wherein a distance between the center of the lower surface of each of the plurality of through holes and the body is greater than a distance between the center of the upper surface of each of the plurality of through holes and the body.

17. The light emitting device package of claim 11, further comprising:
- at least one recess on an upper portion of the body;
- a first resin disposed in the recess; and
- a second resin around a lower portion of the light emitting device,
- wherein the recess overlaps the light emitting device in the vertical direction.

18. The light emitting device package of claim 11, further comprising an upper body disposed around the light emitting device and disposed on the plurality of frames,
- wherein the upper body has a cavity in which the light emitting device is disposed,
- wherein the upper body is connected to the body, and
- wherein the upper body and the body is formed of an insulating material.

19. A light emitting device package comprising:
- a first frame having a first through hole;
- a second frame having a second through hole and spaced apart from the first frame in a first direction;
- a body disposed between the first and second frames; and
- a light emitting device disposed on the first and second frames,
- wherein the light emitting device includes a first bonding portion facing an upper surface of the first through hole and a second bonding portion facing an upper surface of the second through hole,
- wherein each of the first and second through holes has an area of a lower surface larger than an area of the upper surface,
- wherein a part of the first through hole is not overlapped with the light emitting device in a vertical direction, and
- wherein a part of the second through hole is not overlapped with the light emitting device in the vertical direction.

20. The light emitting device package of claim 19, wherein a center of the upper surface and a center of the lower surface of the first through hole are offset from each other in the vertical direction,
- wherein a center of the upper surface and a center of the lower surface of the second through hole are offset from each other in the vertical direction,
- wherein each of the first frame and the second frame is formed of a metal material,
- wherein a thickness of each of the first and second frames is a distance between upper and lower surfaces of each of the first and second frames,
- wherein the first through hole is penetrated from the upper surface of the first frame to the lower surface of the first frame, and
- wherein the second through hole is penetrated from the upper surface of the second frame to the lower surface of the second frame.

* * * * *